(12) United States Patent
Burks et al.

(10) Patent No.: US 10,686,308 B1
(45) Date of Patent: Jun. 16, 2020

(54) SHEATH-BONDING LINK BOX

(71) Applicant: hvGrid-tech Inc., Newmarket (CA)

(72) Inventors: Stephen Burks, Creemore (CA); Gregory Lee, Toronto (CA); Jake Gelhard, Hamilton (CA); William Kevin Jones, Lindsay (CA); Kathryn Klement, Toronto (CA); William McEachern, Thornbury (CA)

(73) Assignee: hvGrid-tech Inc., Newmarket (CA)

(*) Notice: Subject to any disclaimer, the term of this patent is extended or adjusted under 35 U.S.C. 154(b) by 0 days.

(21) Appl. No.: 16/376,787

(22) Filed: Apr. 5, 2019

(51) Int. Cl.
| | |
|---|---|
| *H01R 4/72* | (2006.01) |
| *H01R 9/18* | (2006.01) |
| *H01R 13/46* | (2006.01) |
| *G01R 31/66* | (2020.01) |
| *H05K 5/00* | (2006.01) |
| *H02G 3/08* | (2006.01) |
| *H01R 9/22* | (2006.01) |
| *H01R 9/24* | (2006.01) |
| *H01R 4/30* | (2006.01) |

(52) U.S. Cl.
CPC ............. *H02G 3/088* (2013.01); *G01R 31/66* (2020.01); *H01R 9/223* (2013.01); *H01R 9/2408* (2013.01); *H01R 9/2425* (2013.01); *H01R 9/2458* (2013.01); *H02G 3/081* (2013.01); *H02G 3/086* (2013.01); *H01R 4/308* (2013.01); *H01R 4/72* (2013.01); *H01R 9/18* (2013.01)

(58) Field of Classification Search
CPC .......... H01R 4/305; H01R 4/72; H01R 9/223; H01R 9/2408; H01R 9/2425; H01R 9/2458; H01R 9/18; H01R 9/00; H01R 13/46; H02G 3/088; H02G 3/081; H02G 3/086; H02G 3/00; H05K 5/00; G01R 31/66
USPC ....................................................... 174/520
See application file for complete search history.

(56) References Cited

U.S. PATENT DOCUMENTS 3,848,224 A * 11/1974 Olivero .................. H02G 3/16
439/721
5,656,996 A    8/1997 Houser
(Continued)

FOREIGN PATENT DOCUMENTS

GB          186768 A *  10/1922  ............... H02B 1/00
WO     2001073796 A1   10/2001
(Continued)

OTHER PUBLICATIONS

EMC.22.013—FRP-Link-Box_p. 1_Nov. 30, 2018.*
(Continued)

*Primary Examiner* — Timothy J Thompson
*Assistant Examiner* — Guillermo J Egoavil
(74) *Attorney, Agent, or Firm* — Millman IP Inc.

(57) ABSTRACT

A sheath-bonding link box is provided, the sheath-bonding link box including a housing defining a sealed interior space, and a set of electrically conductive connectors extending through the housing between an exterior of the enclosure and the interior space. The set of connectors each has an internal portion positioned inside of the interior space and an external portion positioned outside of the housing. The internal portion of the connectors is electrically connectable to a functional link in the interior space, and the external portion of the connectors is dimensioned to be electrically connectable to a sheath-bonding lead.

32 Claims, 18 Drawing Sheets

(56) References Cited

U.S. PATENT DOCUMENTS

| | | | |
|---|---|---|---|
| 6,593,525 B1* | 7/2003 | Vanderhoof | H02G 9/10 |
| | | | 174/50 |
| 2011/0263067 A1* | 10/2011 | Vaid | H01L 31/048 |
| | | | 438/65 |
| 2016/0261103 A1* | 9/2016 | Lallouet | H02G 15/34 |
| 2017/0024026 A1 | 1/2017 | Suzuki et al. | |
| 2017/0205459 A1 | 7/2017 | De Rai et al. | |
| 2018/0326429 A1* | 11/2018 | Fritzsch | B03C 1/01 |
| 2019/0097408 A1* | 3/2019 | Czibur | H02G 9/10 |

FOREIGN PATENT DOCUMENTS

| | | | | |
|---|---|---|---|---|
| WO | 2016190823 A1 | 12/2016 | | |
| WO | 2016190824 A1 | 12/2016 | | |
| WO | WO-2016190824 A1 * | 12/2016 | | H02G 15/1055 |

OTHER PUBLICATIONS

EMC.22.014—TRANSPARENT-WINDOW-LINK-BOX_p. 1_Nov. 30, 2018.*

IP Rating Chart—p. 1—Jun. 6, 2017.*

Link Boxes & Bonding Leads for HV Cable Systems_pp. 1-5_Jun. 20, 2018.*

Synth & App-of-reactive-stiffening-agent_Mahmoud et al._pp. 119-126_Aug. 2007.*

High Voltage Cable Systems—Cables and Accessories up to 500 kV, nkt cables, published as early as Apr. 28, 2016.

High Voltage Cable Accessories 72 kV up to 245 kV, nkt cables, published as early as Nov. 6, 2014.

Fiberglass Reinforced Polyester (FRP) Link Boxes, www.emelec.com.tr, revised Nov. 30, 2018.

Changlan Electric Technology Co., Ltd. Product Collection Power Cable Accessories, http://www.csdlfj.com, printed as early as Mar. 22, 2019.

* cited by examiner

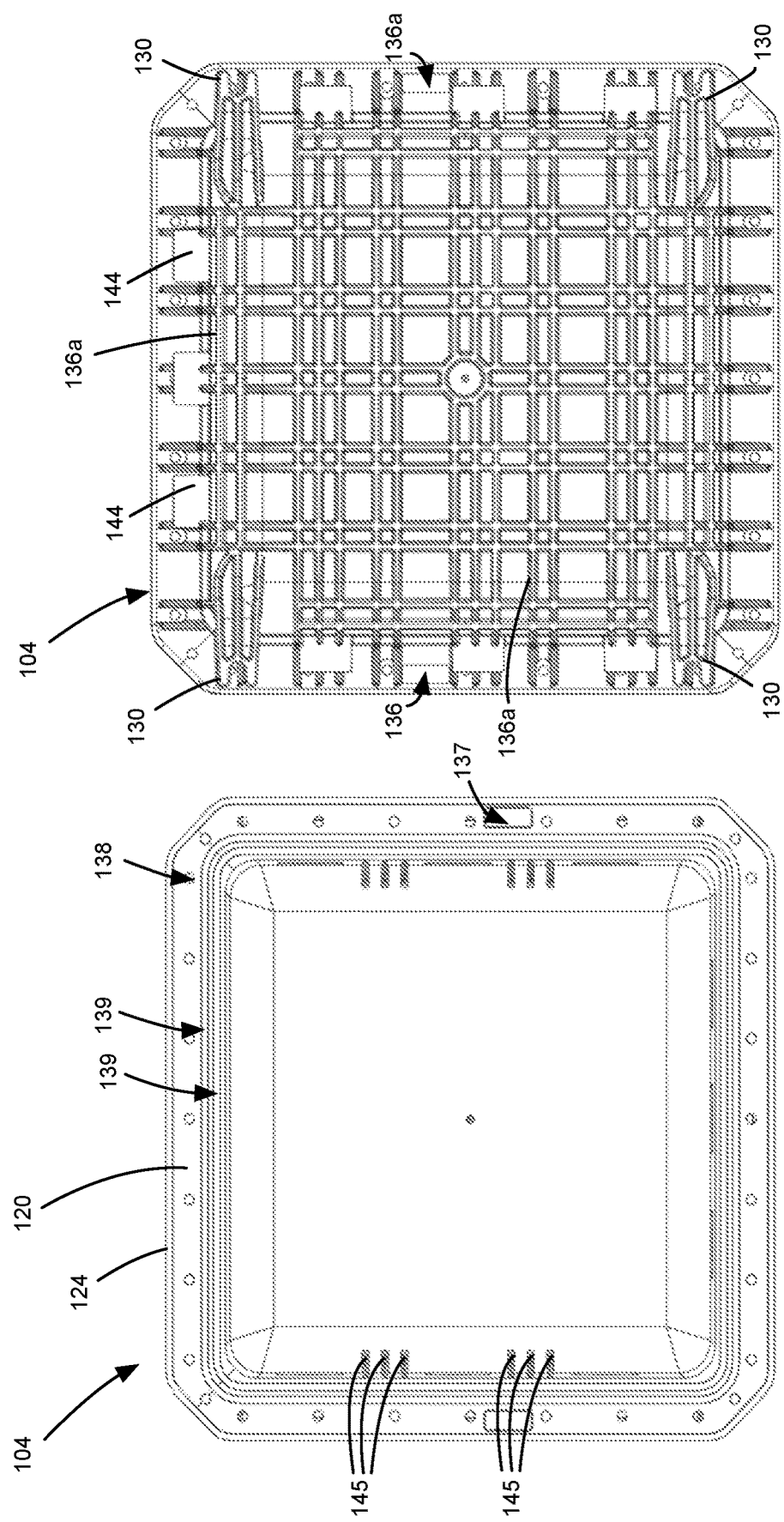

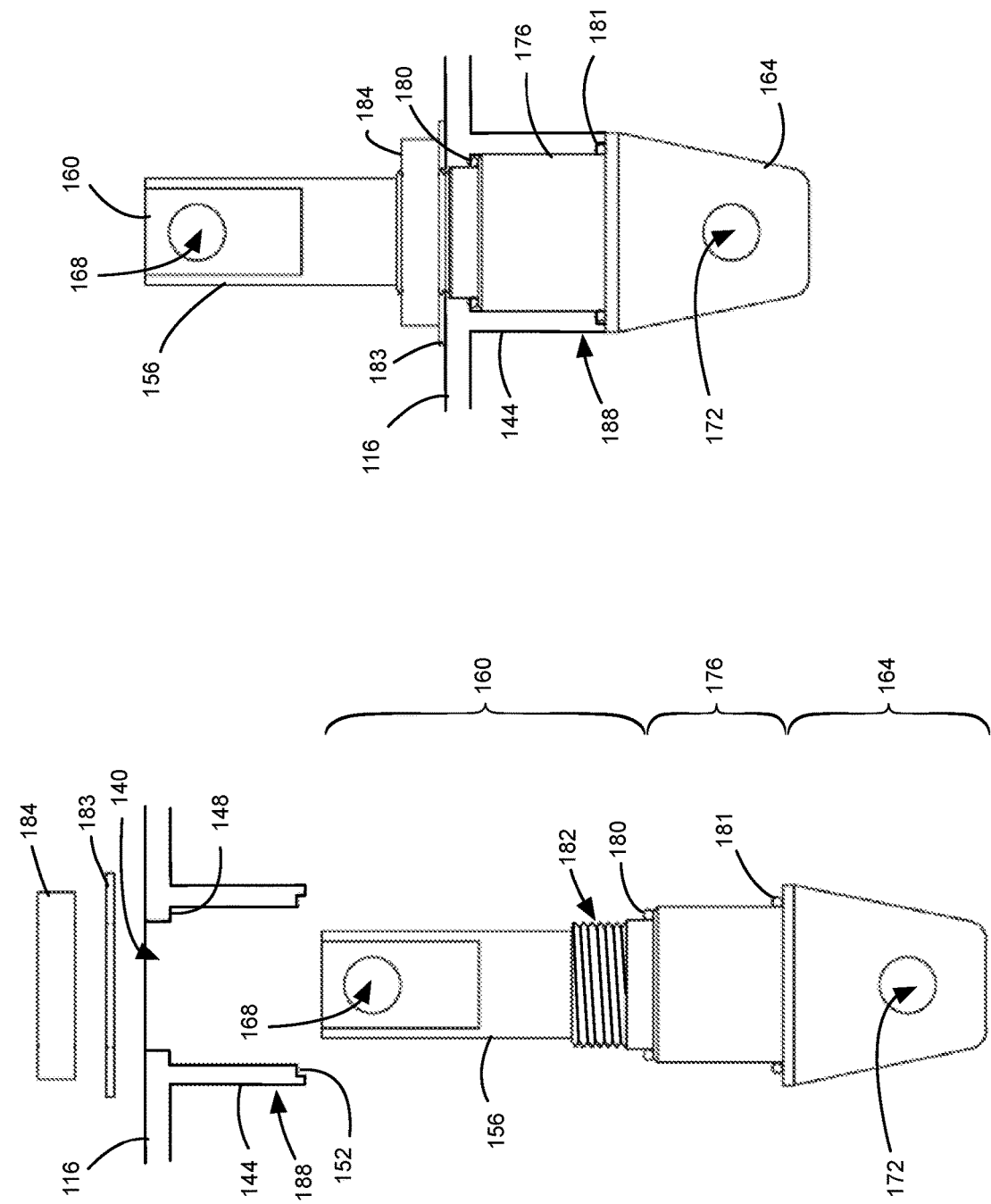

SHEATH-BONDING LINK BOX

FIELD

The specification relates generally to electric power transmission systems. In particular, the following relates to sheath-bonding link boxes for electric power transmission and distribution systems.

BACKGROUND OF THE DISCLOSURE

In urban centers, electrical power is delivered via insulated power cables that are installed in underground pipes, conduits, and tunnels to traverse legs between stations that vary between a few hundred meters and about 20 kilometers in length. In some instances, the insulated power cables are installed in "station exits" between a station and riser pole or other situations where it is necessary to connect an underground cable to an overhead line, in which case the length can be as short as 100 ft. These power cables can also be laid in trenches excavated and backfilled with native soils or select materials or laid directly upon or jetted below the seabed. Each power cable carries a single phase, and three power cables are often grouped together forming a circuit to transmit alternating currents. The power cables installed on electric circuits operating at voltages equal to or higher than 5 kV include a metallic shield or sheath that is applied over the insulated core in order the confine the electric field to the cable and to provide a conductive path for system fault currents to return to their source. During operation, the current flowing in the cable conductor causes standing voltages to form and currents to flow along the sheaths of the power cables. These sheath currents raise the operating temperature of the cable and thus limit the current-carrying capacity of the cable and reduce the efficiency of power delivery.

In an effort to reduce these standing voltages and currents, the sheaths are divided into sheath sections that are then coupled via bonding leads in enclosures called link boxes that are configured to eliminate or reduce the magnitude of these standing voltages and currents. The bonding leads are brought into the link boxes via apertures in their housings and then the conductors thereof are exposed and coupled to internal connectors within the link boxes. These link boxes also serve to balance the voltage and currents across the sheaths to maximize the current carrying capacity of the power transmission system. Additionally, in certain applications, the link boxes may also contain voltage limiting devices known as surge voltage limiters ("SVLs") to limit voltages developed between the sheath and ground to protect the equipment and connected cable system from failure due to lightning strikes and other electrical system disturbances.

As these link boxes are often subjected to damp conditions and, in some cases, may be exposed to intermittent or prolonged submersion in their underground installation locations, such as a manhole, vault or hand hole, the housings and related penetrations must be sealed to inhibit liquid or moisture ingress. Such ingress would at least partially negate the effectiveness of the bonding arrangement afforded by the link boxes, enabling electric current to flow in the cable sheaths thus increasing the operating temperature and reducing the reliability of the power cables.

The link boxes are designed to be opened and closed as required during installation and maintenance activities to periodically inspect the housing, links, and voltage limiters, and intermittently test the insulating properties of the electrical transmission cable system and/or to facilitate fault locating of the electrical transmission cable system. In order to do so, the link boxes are opened and linkages between the bonding cables are reconfigured to enable such testing. Upon completion of the testing, the linkages are typically restored to their normal configuration prior to opening of the link boxes and the link boxes are resealed to protect the exposed conductors of the bonding leads and internal components.

SUMMARY OF THE DISCLOSURE

In one aspect, there is provided a sheath-bonding link box, comprising: a housing defining a sealed interior space; and a set of electrically conductive connectors extending through the housing between an exterior of the enclosure and the interior space, the set of connectors each having an internal portion positioned inside of the interior space and an external portion positioned outside of the housing, the internal portion being electrically connectable to a functional link in the interior space, the external portion being dimensioned to be electrically connectable to a sheath-bonding lead.

The housing can be made of a dielectric material, such as an at least partially polymeric material.

The connectors can be releasably secured to the housing to enable reconfiguration of the sheath-bonding link box. The connectors can be sealably secured to the housing via at least one o-ring.

Each of the set of electrically conductive connectors can be operably electrically connectable to a single-phase sheath-bonding lead.

The sheath-bonding link box further includes a sealing member positioned over each of the set of electrically conductive connectors and the conductor of the single-phase sheath-bonding lead to which it is connected to seal the electrically conductive connector and the conductor of the single-phase sheath-bonding lead.

The sheath-bonding link box can further include at least one sensor positioned inside the interior space and coupled to a control module residing inside or outside the housing, and have a communication module to communicate sensor data via a communications network to a remote computing device.

The housing can include a set of connector support structures, through which the set of electrically conductive connectors extend, wherein at least one of the set of connector support structures is configured to be coupled to and sealed with a corresponding connector support structure of another housing to form a single enclosure.

The sheath-bonding link box can further comprise an electrical separation structure interposed between and fully electrically isolating a first phase and at least one of a second phase and a ground connection in the interior space of the sheath-bonding link box.

The electrical separation structure can include at least one dielectric phase separator that is releasably securable within the interior space of the housing.

The housing can include at least a pair of opposing channels within the interior space for retaining the at least one phase separator.

The at least one dielectric phase separator can be at least two dielectric phase separators positioned between the first phase and the second phase within the interior space of the sheath-bonding link box, and the housing can include at least two pairs of opposing channels within the interior space for retaining the at least two dielectric phase separators.

The electrical separation structure can include a dielectric insulation applied to at least one component.

In another aspect, there is provided a sheath-bonding link box, comprising a housing defining a sealed interior space, the housing being primarily comprised of a dielectric material, wherein the housing has at least one rib extending along an exterior surface thereof to mechanically strengthen the housing to resist rupturing of the housing as a result of an internal pressure surge.

The dielectric material can be an at least partially polymeric material.

The dielectric material can include a stiffening additive.

The housing can include at least a first housing portion and a second housing portion that seal along abutment surfaces thereof to cooperatively form the housing, wherein at least the first housing portion is molded to have at least one annular groove on the abutment surface thereof, and wherein an o-ring is positioned in the at least one circumferential channel between the first and second housing portions to seal therebetween.

The housing can include an at least partially transparent housing cover.

The at least partially transparent housing cover can be an at least partially polymeric panel secured to a housing base.

The at least partially transparent housing cover can extend away from a housing base to which the at least partially transparent housing cover is secured towards a middle region of the at least partially transparent housing cover.

The housing can have at least one other rib extending along the exterior surface thereof, the at least one other rib extending one of obliquely and normal to the at least one rib.

The housing can have at least one circumferential rib extending circumferentially about the housing.

The sheath-bonding link box can further include an electrical separation structure interposed between a first phase and at least one of a second phase and a ground connection in an interior space of the sheath-bonding link box.

The electrical separation structure can include at least one dielectric phase separator releasably securable within the interior space of the housing.

The housing can include at least a pair of opposing channels within the interior space for retaining the at least one phase separator.

The at least one dielectric phase separator can be at least two dielectric phase separators positioned between the first phase and the second phase within the interior space of the sheath-bonding link box, and the housing can include at least two pairs of opposing channels within the interior space for retaining the at least two dielectric phase separators.

In a further aspect, there is provided a sheath-bonding link box, comprising a housing defining a sealed interior space, the housing including a housing cover made of an at least partially transparent polymeric material.

The housing cover can include an at least partially polymeric panel that is securable to a housing base.

The housing cover can extend away from a housing base to which the housing cover is secured towards a middle region of the housing cover.

The housing can include a housing base that seals with the housing cover along abutment surfaces thereof to cooperatively form the housing, wherein at least one of the housing base and the housing cover is molded to have at least one annular groove on the abutment surface thereof, and wherein an o-ring is positioned in the at least one circumferential channel between the housing base and the housing cover to seal therebetween.

In yet another aspect, there is provided a sheath-bonding link box, comprising: a housing defining a sealed interior space; and at least one sensor positioned inside the interior space and coupleable to a control module to communicate sensor data received from the at least one sensor via a communications network to a remote computing device.

The control module can be positioned within the interior space of the housing.

The control module can be integrated into a transparent cover and positioned away from a central region of the transparent cover.

In still yet another aspect, there is provided a sheath-bonding link box, comprising: an enclosure; and a mounting structure for mounting the enclosure to a mounting surface, the mounting structure spacing the enclosure from the mounting surface sufficiently to inhibit contact of the enclosure during expansion of the enclosure due to an increase in internal pressure with sufficient force against the mounting surface to damage the mounting structure.

In another aspect, there is provided a sheath-bonding link box, comprising: a sealed enclosure, the enclosure housing a first phase and at least one of a second phase and a ground connection in an interior space thereof; and an inert gas positioned in the interior space to inhibit arcing between the first phase and the at least one of the second phase and the ground connection.

In a further aspect, there is provided a sheath-bonding link box, comprising: an electrical separation structure interposed between and fully electrically isolating a first phase and at least one of a second phase and a ground connection in an interior space of the sheath-bonding link box.

The electrical separation structure can include at least one dielectric phase separator releasably securable within the interior space of the housing.

The sheath-bonding link box can further include at least one pair of opposing channels within the interior space for receiving the at least one dielectric phase separator.

The at least one dielectric phase separators can be at least two dielectric phase separators and the at least one pair of opposing channels can include at least two pairs of opposing channels within the interior space for receiving the at least two dielectric phase separators.

The electrical separation structure can include a dielectric insulation applied to at least one component.

In still yet another aspect, there is provided a sheath-bonding link box, comprising: a housing defining a sealed interior space, wherein the housing includes at least one external port; and a housing coupler sealably coupleable to or extending from one of the at least one external port of the housing at a first end thereof, and sealably coupleable to a corresponding one of the at least one external port of another housing at a second end thereof, the housing coupler having a through-hole extending from the first end to the second end thereof, wherein a single enclosure is formed when the housing coupler is coupled to or extends from the housing and is coupled to the other housing.

The housing can be coupled to another housing via the housing coupler, the sheath-bonding link box further comprising: at least one sensor positioned inside the interior space and coupled to a control module positioned in the other housing via the housing coupler to communicate sensor data received from the at least one sensor via a communications network to a remote computing device.

BRIEF DESCRIPTIONS OF THE DRAWINGS

For a better understanding of the various embodiments described herein and to show more clearly how they may be carried into effect, reference will now be made, by way of example only, to the accompanying drawings in which:

FIGS. 5A to 5D show the housing base of the link box of FIG. 4;

FIGS. 6A and 6B show a connector being fitted into a port of the link box housing base of FIGS. 5A to 5D;

Figure 1:
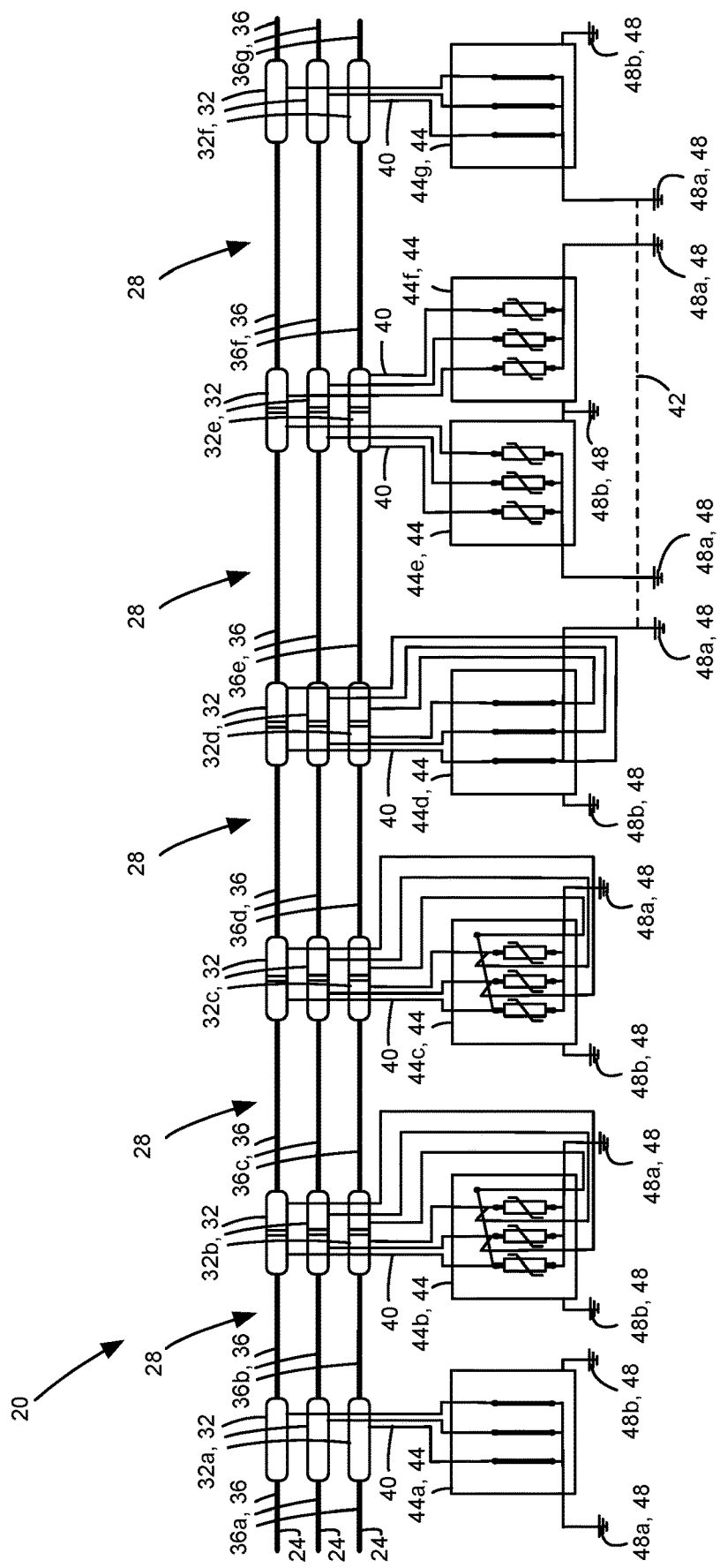
FIG. 1 shows a conventional electric power transmission system.

Unless otherwise specifically noted, articles depicted in the drawings are not necessarily drawn to scale.

DETAILED DESCRIPTION

For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

FIG. 1 is a schematic diagram of a portion of a conventional three phase power cable system 20 that includes three power transmission lines (typically one line per phase) 24. Each of the power transmission lines 24 is segmented into seven cable sections 28 at six cable joints 32a to 32f (collectively alternatively referred to herein as cable joints 32). The cable joints 32 also divide the cable sheaths of the power transmission lines 24 into seven sheath sections 36a to 36g (collectively alternatively referred to herein as sheath sections 36). These sheath sections 36 are typically about 650 meters on average in length, but can typically range in length from less than 100 m to over 1200 m depending on the installation conditions. The power cable system 20 illustrated has a hybrid sheath bonding scheme, allowing sheath circulating currents and standing voltages to be minimized and/or mitigated.

The sheaths of the cables in sections 36b to 36d are cross bonded. In sheath cross bonding, the circuit length is divided into groups of three cable sections called "tri-sections" that allow the sheaths of each of the phase cables to be joined to each other in a consistent pattern, and are preferably near equal in length. The cable joints 32b and 32c contain sectionalizing insulators that interrupt the cable sheath continuity across the joint. Insulated bonding leads are used at each of the cable joints 32a to 32d to interconnect the sheath sections 36b to 36d in link boxes 44a to 44d in a specific sequence to neutralize the currents that would otherwise exist therealong had the sheath been continuous across the joint. When the phase currents are balanced and the cable sheath connection is rotated from one phase conductor of the cable circuit to another along the length of the circuit, the induced voltages in the cable shields cancel resulting in relatively low levels of induced sheath voltage and very little circulating current. As the sheaths provide the ground return path, there is no requirement for a separate ground continuity conductor and this can be eliminated.

The sheath sections 36e and 36f of the power transmission lines 24 are single-point bonded. In single-point bonding, the sheaths of the three cable phases are connected to ground at one point in each section. Insulated bonding leads 40 are used at the cable joint 32*d* to bond the sheath sections 36*e* to ground and at the cable joint 32*f* to bond the sheath sections 36*f* to ground. The ends of each sheath section 36*e* and 36*f* that are not grounded are connected to ground through sheath voltage limiters ("SVLs"), which act as an open circuit under normal conditions so that no current flows in the sheath. The cable joint 32*e* contains a sectionalized insulator to interrupt the cable sheath continuity between sheath sections 36*e* and 36*f*. In this single point bonding configuration, a ground continuity conductor 42 is usually required to provide a closely coupled return path for zero sequence fault current.

Each end of every sheath section 36 is coupled via bonding leads 40 to the link boxes 44*a* to 44*g* (alternatively referenced to herein as link boxes 44) that are used to bond the three cable sheaths to each other, to provide a low resistance ground connection, or to provide an open circuit point between the cable sheath and ground. The bonding leads 40 are single conductor insulated leads in the illustrated embodiment, but, in alternative embodiments, the bonding leads can be coaxial cable whereby the inner and outer conductor are connected to opposing sides of the sheath interruption. This allows for a single cable connection at the cable joint and also reduces the number of link box penetrations. Cross-bonding link boxes 44*b*, 44*c* are used at the two intermediate cable joints 32*b*, 32*c*, where the cross connections are made within the link boxes 44. These cross-bonding link boxes 44*b*, 44*c* incorporate sheath voltage limiters to clamp transient voltages to sustainable levels during system disturbances. The grounding link boxes 44*a*, 44*d*, and 44*g* are used at the cable joints 32*a*, 32*d*, and 32*f* to connect the sheaths to ground. SVL link boxes 44*e* and 44*f* are used at the cable joint 32*e* to provide an open circuit point for the sheath sections 36*e* and 36*f* and thus eliminate the flow of sheath current under normal conditions while incorporating SVLs to limit transient voltages to sustainable levels. Further, ground connections 48*a* are coupled either to the bonding leads 40 or to the SVLs inside the link boxes 44 effectively grounding the bonding leads 40 or SVLs to provide a path to ground for normal or transient current to flow. The link boxes 44 themselves conventionally have metal housings that are exposed to currents and voltages from the bonding leads 40 and the failure of internal components. For personal safety reasons, the link boxes 44 are grounded via ground connections 48*b*. Ground connections 48*a* and 48*b* may be collectively alternatively referred to hereinafter as ground connections 48.

Figure 2:
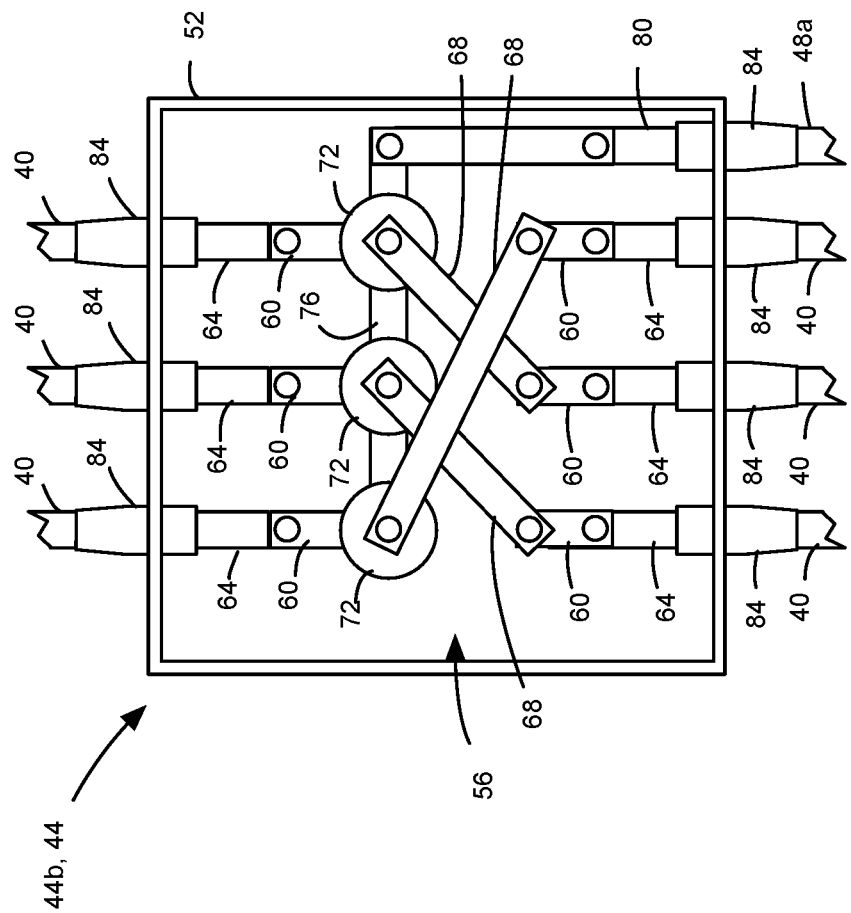
FIG. 2 shows a plan view of a link box for sheath bonding in the electric power transmission system of FIG. 1.

FIG. 2 shows the various components of the conventional cross-bonding link box 44*b* in greater detail. Each of the bonding leads 40 enters a housing base 52 of the link box 44*b* via a port and is coupled to one of a set of functional links 56 within the housing base 52. In the case of the cross-bonding link box 44*b*, the functional links 56 include a set of bond lead terminals 60 that also serve to secure a conductor 64 of each bonding lead 40 as well as three cross-bonding links 68 that cross-bond the sheath sections 36 of the different cable sections 28. The cross-bonding links 68 link the bond lead terminals 60 so that a first of the cross-bonding links 68 couples the bonding lead 40 from a first sheath section 36 of a first of the power transmission lines 24 to a second sheath section 36 of a second of the power transmission lines 24, a second of the cross-bonding links 68 couples the bonding lead 40 from a first sheath section 36 of the second of the power transmission lines 24 to a second sheath section 36 of a third of the power transmission lines 24, and a third of the cross-bonding links 68 couples the bonding lead 40 from a first sheath section 36 of the third of the power transmission lines 24 to a second sheath section 36 of the first of the power transmission lines 24. Each of the three bond lead terminals 60 on one side is coupled to an SVL 72. The base of each of the SVLs 72 is coupled to a cross bar 76 that, in turn, is coupled to a ground cable conductor 80 of a cable for the ground connection 48*a*.

A sealing nut 85 including a gland 84 is secured to a port 86 of the housing base 52 and over the bonding lead 40. The gland 84 is made of a pliable and resilient material such as a suitable polymer.

Figure 3:
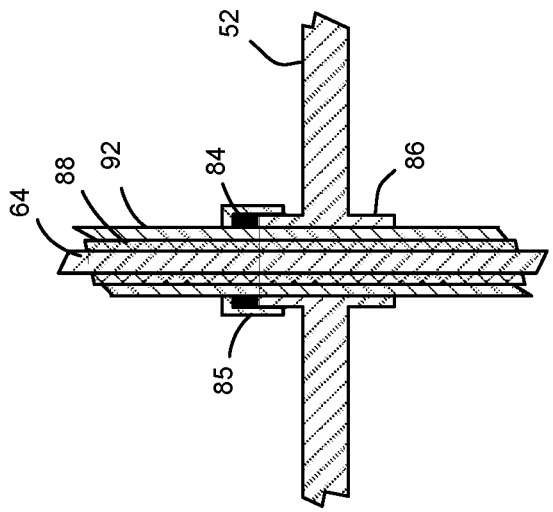
FIG. 3 is a partial section view of a port of the link box of FIG. 2.

Now referring to FIGS. 2 and 3, each of the bonding leads 40 consists of the conductor 64 covered by a factory-applied insulation 88 that is extruded but can be fibrous. The insulation 88 is covered with a factory-applied jacket 92 that is waterproof or highly water resistant.

In order to connect a bonding lead 40 to a link box 44, a length of the jacket 92 and the insulation 88 at an end of the bonding lead 40 are stripped from the conductor 64. The end of the bonding lead 40 is then fed through the gland 84 from an exterior of the link box 44 and into the interior space 56, where it is connected to the bond lead terminal 60 using a suitable fitting like a cable lug. The gland 84 is then compressed via threading of the sealing nut 85 onto the port 86, sealing against the bonding lead 40 and in some cases, heat-shrink tubing is applied over the connection. If the seal between the gland 84 and the bonding lead 40 is not adequate, however, water present outside the link box 44 can enter into the link box 44, particularly when the link box 44 is submerged.

Once the bonding leads 40 are connected in the link box 44, a cover (not shown) of the housing is positioned over the housing base 52. A set of sealing gaskets along a periphery of the cover and the housing base 52 act to seal the housing. The cover is secured to the housing base 52 via a set of bolts that are to be torqued with a particular torqueing force in order to ensure that the cover and the housing base 52 compress the sealing gaskets sufficiently to seal the housing.

During the service life of the link box 44, the link box is routinely opened to check the condition of the components housed therein or to run testing. During testing, the functional links 56 and SVLs 72 may be temporarily reconfigured or removed to verify that the cable sheaths are isolated from ground and that the cable jackets have adequate dielectric strength to withstand transient voltage greater than the limit of the SVLs 72. On occasion, workers opening and closing these link boxes 44 may not apply the correct torque to the bolts. Undertorqueing the bolts can lead to a less-than-waterproof seal, enabling water to seep into the interior space 56, such as when the link box 44 may be submerged in water. As will be appreciated, the ingress of water into the link box 44 can corrode the components and, more importantly, facilitate electrical bridging of the phases, thereby potentially leading to arcs that can damage the link box 44 and current flow in the cable sheaths potentially increasing the cable temperature and compromising the entire electric power transmission system 20. If the torque applied to the bolts is too great, the excessive compression of the gaskets may lead to the deterioration of their resilience.

Further, any compromises along the length of the jacket 92 of any of the bonding leads 40 can allow water, if present, to enter the jacket 92. The insulation 88 and the stranded conductor 64 can act as a wick, drawing water along the inside of the jacket 92 and depositing the water inside the link box 44 where the conductors 64 of the bonding leads 40, the functional links 56, and the SVL connections are exposed.

While a particular configuration of the link box 44 is shown in FIGS. 1 and 2, it will be appreciated that these issues exist with most, if not all, link boxes 44.

Due to the placement underground of these sheath-bonding link boxes 44 in urban environments, it can be expensive to inspect the link boxes 44 to ensure that they are functioning properly and in good physical condition. As a result, such link boxes 44 are only inspected infrequently (about once every five years) or after an issue arises, such as in performing cable circuit fault detection when deterioration in performance of an electric power transmission system is noted. Also, inspection of a link box 44 typically involves its opening and closing, thus increasing the probability of its malfunctioning due to improper resealing. Thus, it can be challenging to proactively avoid issues with such sheath-bonding link boxes 44, and they are generally operated to the point of failure, which can lead to more consequential failure of the power cable system.

Figure 4:
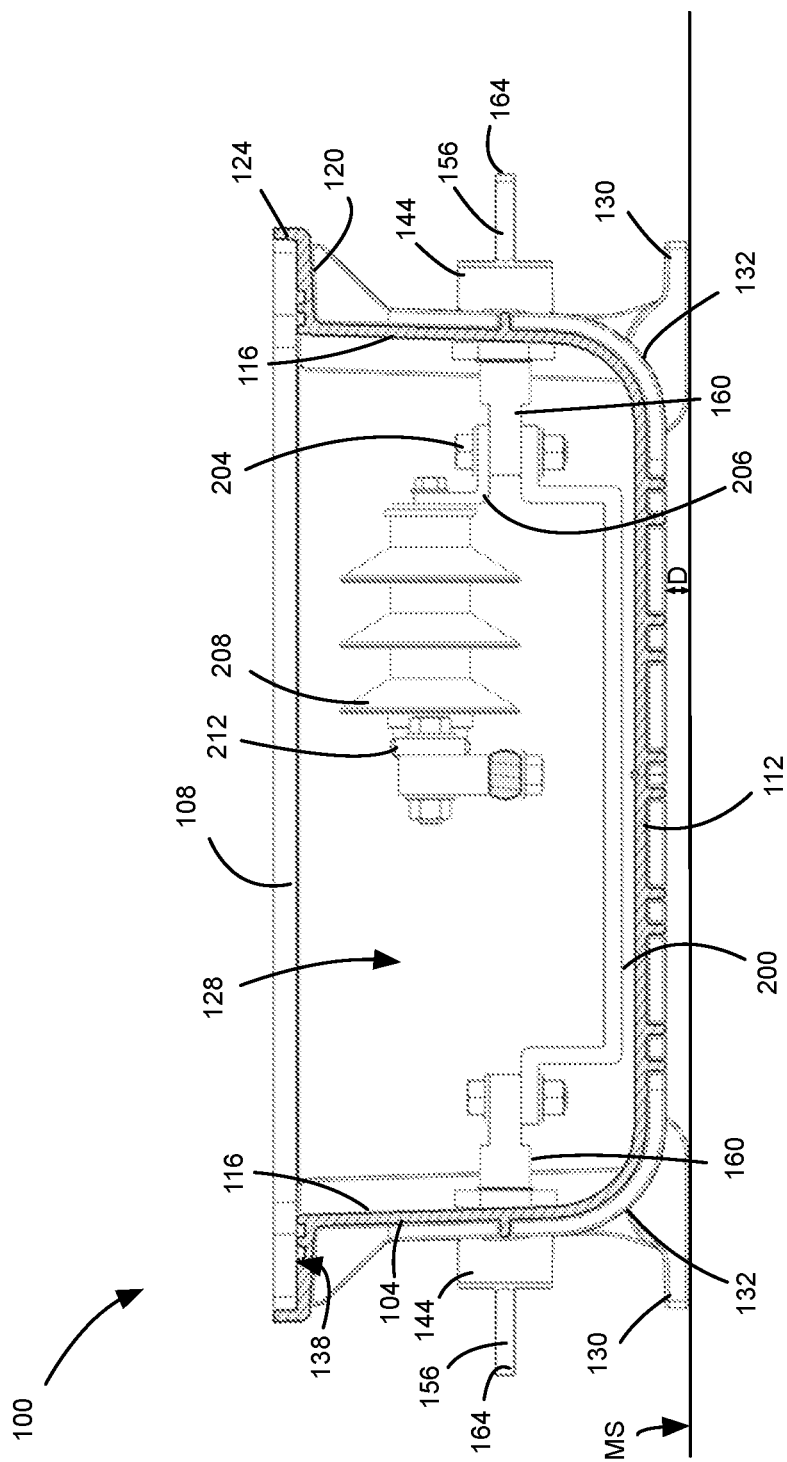
FIG. 4 is a side section view of a link box in accordance with an embodiment.

FIG. 4 shows a link box 100 in accordance with an embodiment. The link box 100 is designed to be configured once and sealed without the need to repetitively reopen the link box for inspection or to perform testing. Further, in some embodiments, monitoring of the link box 100 and sheath bonding status is performed automatically and the link box 100 and sheath bonding status is communicated to a remote computing device to enable remote monitoring of the link boxes. In this manner, some issues can be proactively identified, reducing the need to intermittently check the status of the link box 100. Various other advantages will be described and/or become apparent from the following discussion.

The link box 100 has a housing primarily made of two housing portions, namely a housing base 104 and a housing cover 108 that seal together to form an enclosure. The housing base 104 has a floor 112 from which four sidewalls 116 extend upwardly. A flange 120 extends outwardly from a top edge of the sidewalls 116. A flange lip 124 extends upwardly around the flange 120. The housing cover 108 is generally planar and is dimensioned to rest atop of the flange 120 and fit within the flange lip 124. The flange 120 provides an abutment surface urged into contact with a peripheral abutment surface of the housing cover 108 when the housing base 104 and the housing cover 108 are sealed together. When the housing cover 108 is positioned atop of the housing base 104, the housing base 104 and the housing cover 108 seal to define an interior space 128. A set of four mounting feet 130 extend laterally from the floor 112 to enable mounting of the link box 100 in a location, such as, for example, a vertical or a horizontal surface.

Figure 5A:
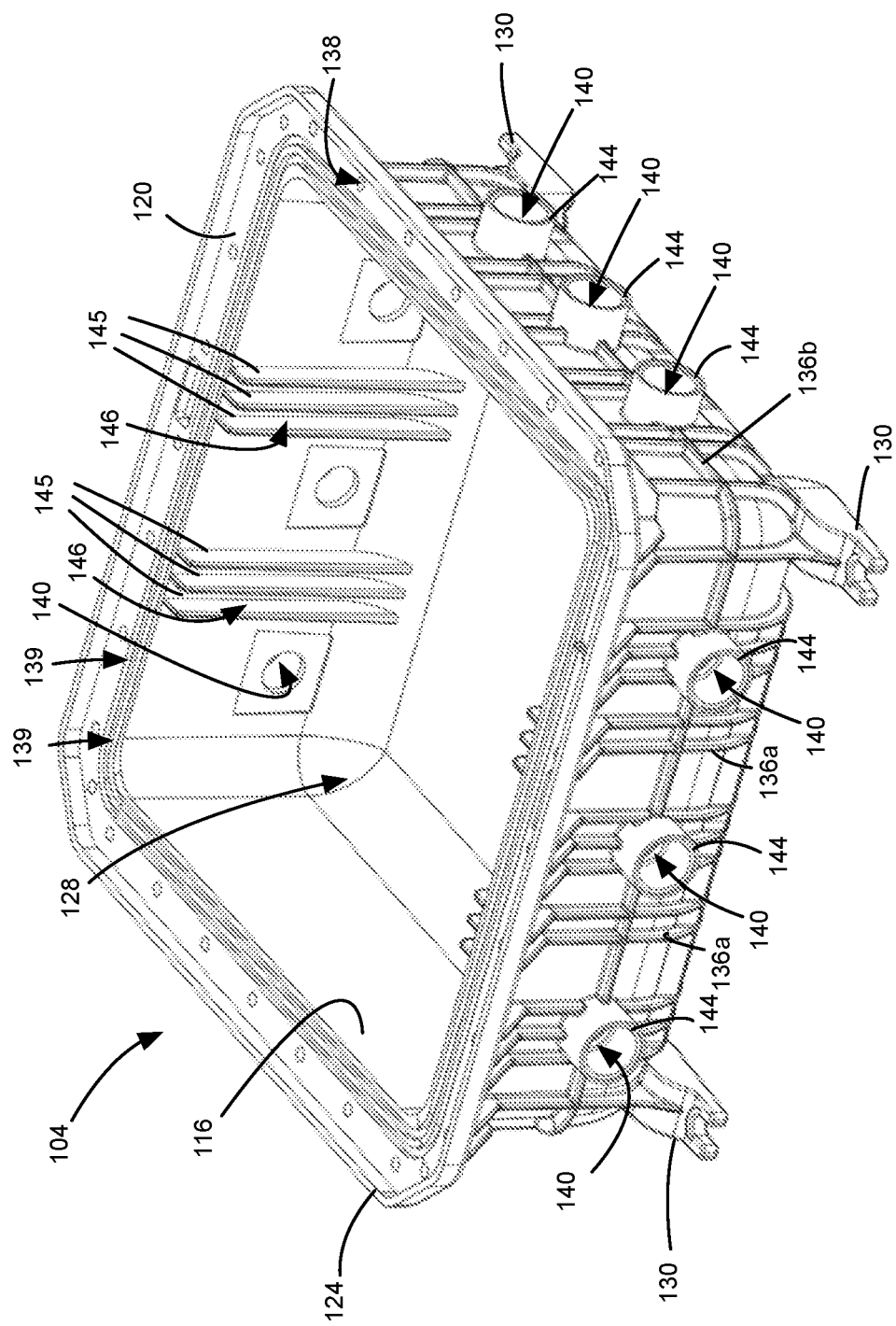
Figure 5B:
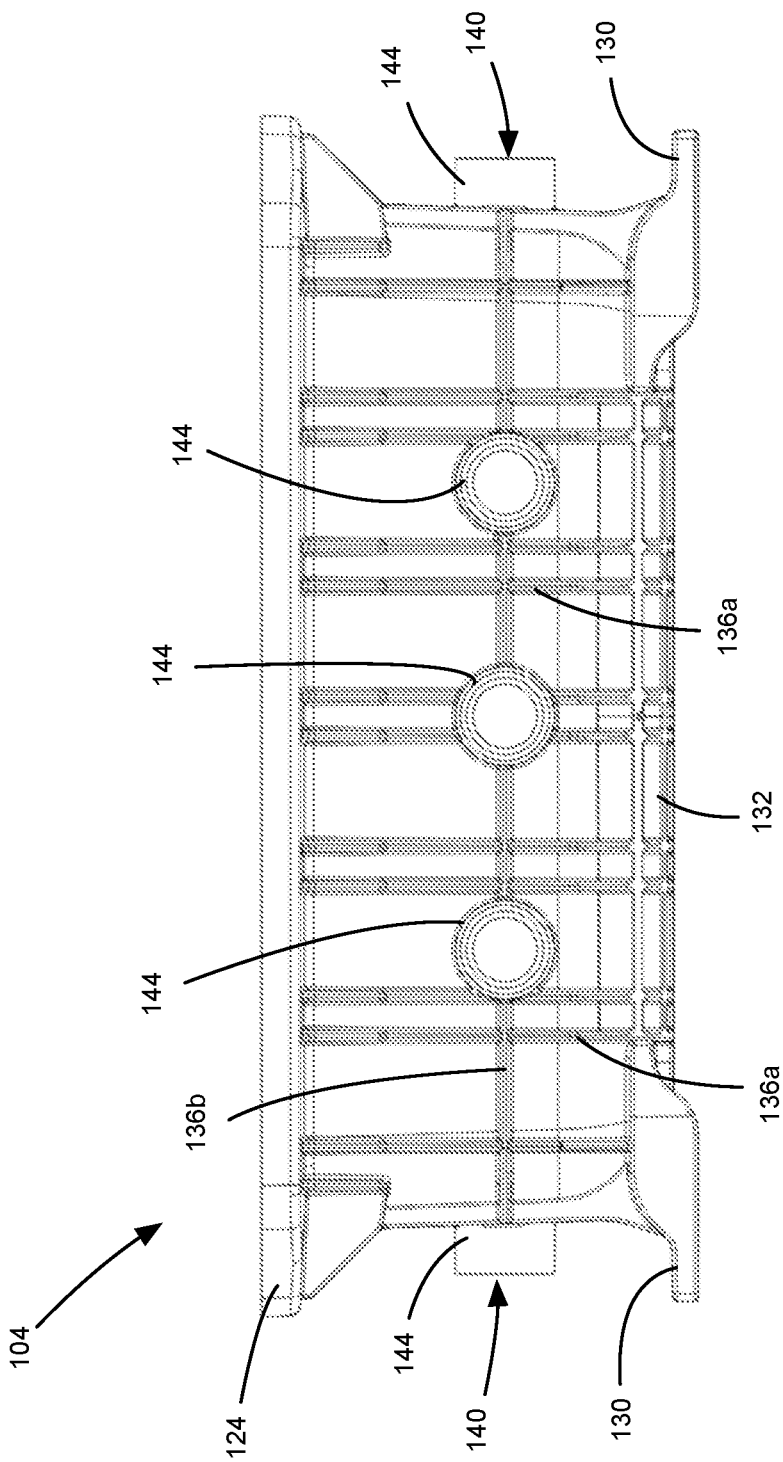

Referring now to FIGS. 4 to 5D, the housing base 104 is injection molded from a material that is at least partially a polymer. The material is preferably an at least partially polymeric material, that is, a material that includes a polymer, such as a polymeric compound that contains additives to achieve desired properties. In particular, the material is a polybutylene terephthalate (hereinafter "PBT") that is mixed with 30% glass fiber by weight, UV stabilizer, and a flame-retardant additive. Depending on the application, the amount of glass fiber by weight can be varied. Other materials that are suitably non-conductive can also be employed, such as fiberglass or other suitable polymers like polyphenylene sulfide. Preferably, the material from which the housing is made has a suitable balance of properties, including rigidity, flexibility, very low water absorption rate for prolonged submersion, ultra-violet (UV) resistance for outdoor applications and good chemical stability in case of presence in the manhole of gas, oil, pesticides, salt water, etc. The glass fiber acts as a stiffening additive; that is, an additive that acts to increase the overall stiffness of the material. Where it is desirable to add rigidity to a base material from which the housing is made, a stiffening additive can be added to the base material. Any other stiffening additive that is suitably non-conductive and that is suitable for use with the base material can be employed.

The dimensions of the link box 100 were selected to contain the internal components including links, busbars, connectors, and SVLs for a range of desired voltage ratings and different internal configurations, while still being sized to fit through a standard man hole opening. Additional or other sizes can be selected depending upon the application's requirements. A thickness of ¼ inch was selected to facilitate injection molding of the housing base 104.

It is desirable for the housing to be able to withstand the pressure bursts associated with an internal electrical arc, so that, during such internal pressure surges, the housing does not rupture or break open and no debris is ejected. The material of the housing is sufficiently flexible to withstand expansion as a result of a surge in pressure from an arc flash event while being sufficiently rigid to contain the pressure.

Longitudinal ribs 136a are included around the flange 120 to keep the flange 120 secured to the side walls of the housing base 104 in the event of an arc. The longitudinal ribs 136a extend down the exterior of each of the four sidewalls 116 and continue around the floor 112 of the housing base 104 to form a lattice pattern on the bottom and over the curved sections 132 in order to strengthen them. Additional longitudinal ribs 136a extending in a transverse orientation are included around the curved section 132. Further, a circumferential rib 136b extends circumferentially around the sidewalls 116 of the housing base 104 and traverses the longitudinal ribs 136a to further reinforce the housing. In other embodiments, it can be desirable to have ribs that extend obliquely or normal to other ribs to provide rigidity along two axes along portions of the housing.

When the link boxes experience an internal pressure spike from an arc flash event, the housing expands rapidly. The ribs 136a, 136b assist in maintaining the integrity of the housing base 104, but the ballooning of the housing can be significant. The floor 112 of the housing base 104 can also balloon. If the link box 100 was flush-mounted as with prior art link boxes, the ballooning floor 112 can push against a mounting surface MS to which the link box 100 is secured to urge the link box 100 away from the mounting surface MS, possibly to the point of separation of the mounting feet 130 therefrom. The mounting surface MS can be vertical, horizontal, or oriented in any known manner. To accommodate this expansion, the mounting feet 130 of the link box 100 space the floor 112 of the link box 800 from the mounting surface MS by a distance D to provide the floor 112 with room for expansion without pressing against the mounting surface MS sufficiently to cause the link box 100 to rupture the mounting feet 130 and separate from the mounting surface MS.

Using a dielectric material for the housing makes it possible to install metallic connectors that are in contact with the side walls. This would not be possible in a metal enclosure because the enclosure would form a short circuit between the connector and the metallic housing which must be grounded for safety. By using these metallic connectors as penetrations though the non-conductive dielectric housing, there is no need for insulated cables to enter the link box through penetrations, eliminating the possibility that water can enter the link box through either a poor seal between the bonding lead and the cable gland or by being wicked between the bonding cable insulating jacket and the conductor, and/or within the stranded conductor from an opening in the cable jacket. A seal can be made using the metallic connector and o-rings that provides superior performance compared to a cable gland, greatly improving the ability of the link box to withstand prolonged submersion. Further, the electrically insulating properties of the housing of the link box 100 reduces the probability that workers would be subjected to voltage potential associated with unexpected contact of the internal components with the enclosure resulting in the fault currents that would otherwise be present in metal enclosures. Still further, polymers and at least partially polymeric materials provide other improvements compared to a stainless steel enclosure because a polymer or at least partially polymeric material enclosure can be made by injection molding, which is faster compared to the machining process used to make a stainless steel enclosure. By injection molding the enclosure other features, for example the annular grooves to be discussed, can be included in the enclosure without the need for additional costly machining. The use of an at least partially polymeric material also mitigates the need to ground the enclosure.

The housing cover 108 is made of a flat panel of clear polycarbonate that is of a sufficient thickness to withstand pressure transients associated with arc flashes within the link box 100, a range of operating temperatures, and pressure differentials. A number of bolt holes are positioned along the periphery of the housing cover 108 and align with a set of bolt holes 138 in the flange 120 to enable securing of the housing cover 108 to the housing base 104. A pair of annular grooves 139 is formed in the upper surface of the flange 120 in which large o-rings are positioned. Additionally or alternatively, the housing cover 108 can be made with at least one annular groove in which the o-rings are fitted. The use of two large o-rings to seal together the housing base 104 and the housing cover 108 is an improvement compared to a gasket that is used in the prior art link box 44 because it can maintain the seal under a greater pressure differential, for example, such as would be experienced during an internal arc event or in the event of submersion of the link box. As the housing cover 108 is made from a single piece of at least partially transparent material, visual inspections of the contents of the link box 100 can be performed without opening the link box 100. A pair of cover release apertures 137 in the flange 120 enable the cover 108 to be manually separated from the housing base 104 after removal of bolts securing the housing base 104 and the housing cover 108 together, if required.

In the illustrated embodiment of FIG. 5A, the link box 100 has nine connector ports 140 extending through connector support structures in the form of connector sleeves 144. The connector sleeves 144 intersect the circumferential rib 136b, which reinforces the connector sleeves 144 to mitigate lateral forces that may be applied to the connector sleeves 144 during connection of bonding leads 40. The connector ports 140 can be employed for a number of purposes. The link box 100 has three connector ports 140 on each of two opposing side walls 116 that are configured to accommodate three cable phases entering each of the opposing side walls 116 of the housing, for six in total. In addition, a third side wall 116 of the housing is configured with three connector ports 140. One connector port 140 is used for a ground connection, and two connector ports 140 are spare ports. These spare ports may be used as communication ports or pressure relief ports, as will be described herein below.

A set of separator supports 145 is formed on an interior surface of two opposing sidewalls 116. The separator supports 145 extend parallel to one another from the curved section 132 up towards the flange 120 and define separator channels 146. In particular, two sets of three separator supports 145, each defining two adjacent separator channels 146 are positioned between the connector ports 140 on opposing side walls 116.

Now referring to FIGS. 6A and 6B, the connector sleeve 144 has an inner diameter that is slightly larger than the connector port 140 in the sidewall 116. This disparity results in an annular ledge 148 about the inside of the connector sleeve 144 on the outside surface of the sidewall 116. An inner annular channel 152 is formed in the longitudinal end of the connector sleeve 144.

An electrically conductive connector 156 is inserted from outside the enclosure into each of the opposing connector ports 140 in three opposed pairs, and into one of the connector ports 140 on the sidewall 116 extending between the sidewalls 116 with the three opposing pairs of connector ports 140. The connector 156 has an internal portion 160 and an external portion 164. The internal portion 160 acts as an internal interface of the connector 156 that is electrically connectable to a functional link, and the external portion 164 acts as an external interface of the connector 156 that is electrically connectable to a sheath-bonding lead. A first bolting aperture 168 extends through the internal portion 160 and a second bolting aperture 172 extends through the external portion 164. The internal portion 160 of the connector 156 is dimensioned to pass through the connector port 140. A central portion 176 bridges the internal portion 160 and the external portion 164, and is dimensioned to fit snugly within the connector sleeve 144. The external portion 164 is dimensioned to inhibit passage through the connector sleeve 144. A first o-ring 180 is fitted around the internal portion 160 and positioned against the central portion 176. A second o-ring 181 is fitted around the central portion 176 and positioned against the external portion 164.

When the connector 156 is inserted into the connector sleeve 144, the internal portion 160 passes through the connector port 140 and the central portion 176 fits into the connector sleeve 144. The o-ring 180 fitted around the internal portion 160 is urged into abutment with the annular ledge 148 to provide a first seal, and the o-ring 181 fitted around the central portion 176 is urged into abutment with the inner annular channel 152 of the connector sleeve 144 to provide a second seal, as shown particularly in FIG. 6B.

A threaded portion 182 of the internal portion 160 is positioned closest to the central portion 176 of the connector 156. Once the connector 156 is inserted into the connector sleeve 144, a locking washer 183 is applied around the threaded portion 162 and held in place against the sidewall 116 using a nut 184 that is screwed in place with a prescribed torque over the threaded portion 182 of the connector 156. The nut 184 is preferably non-metallic. By applying the locking washer 183 and nut 184, the connector 156 is held securely in place and the two o-rings 180 and 181 are compressed to provide a suitable seal.

Thus, the connector support structures physically support the connectors 156 and seal with the connectors 156. While, in this embodiment, the connector support structures are connector sleeves 144, they may take other forms in other embodiments that are suitable for supporting and sealing with the connectors.

Figure 7A:
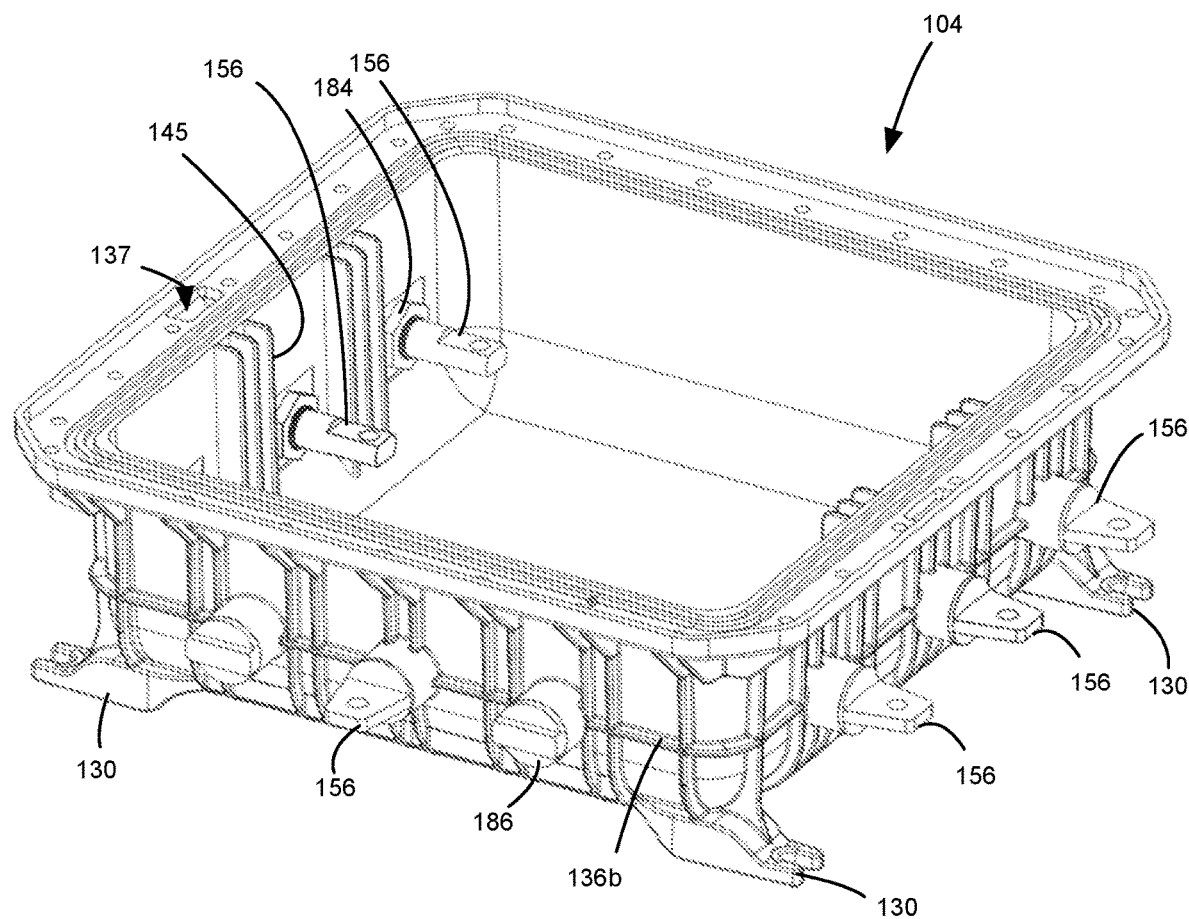
FIGS. 7A and 7B are perspective and side elevation views of the link box housing base of FIGS. 5A to 5D after fitting of the connectors.
Figure 7B:
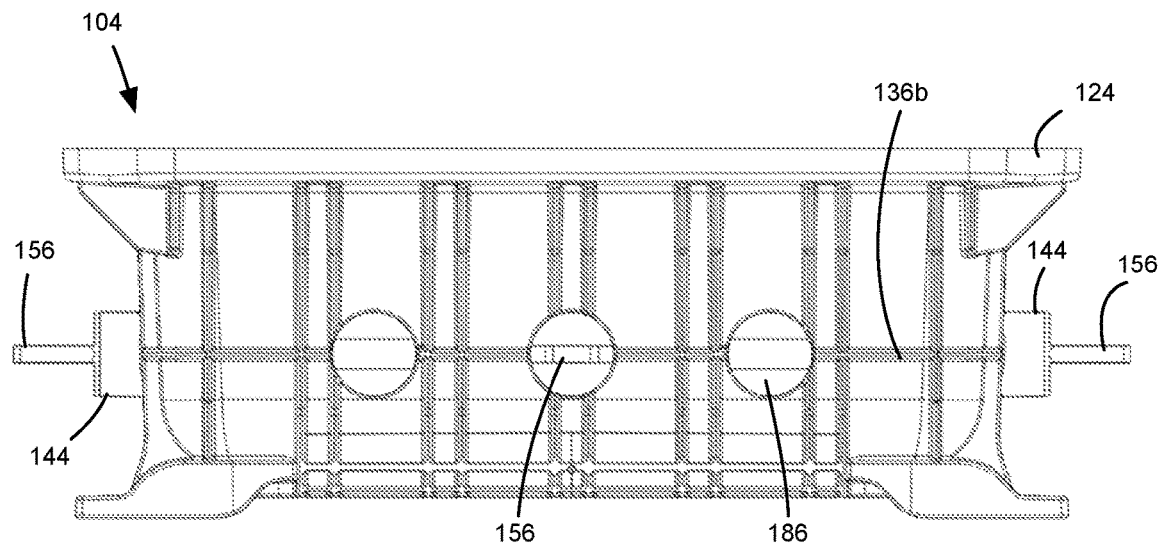

FIGS. 7A and 7B show the housing base 104 after insertion of seven of the connectors 156. In particular, connectors 156 have been inserted into three opposing pairs of connector ports 140, as well as in one of the additional connector ports 140. A sealing cap 186 is shown sealing each of the two remaining connector ports 140. The sealing caps 186 have a similar dimension and set of o-rings as the connector 156 so that when the sealing caps 186 are fitted in the connector sleeve 144 and the connector port 140, the connector port 140 is sealed. As will be understood, the connectors 156 are releasably secured in the connector sleeves 144 and the connector ports 140 so that the connectors 156 can be removed and/or inserted to reconfigure the link box 100 as required.

Figure 8:
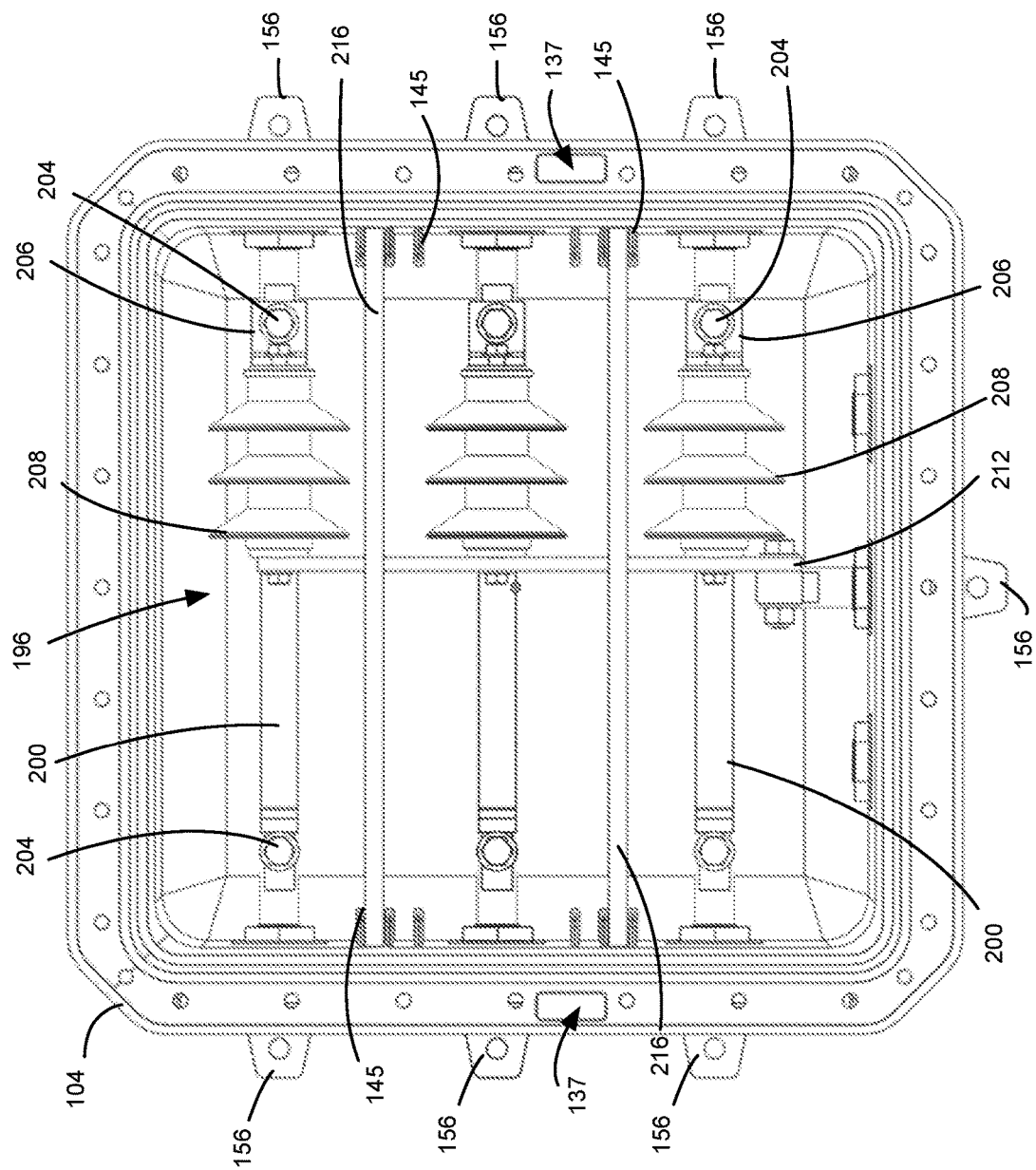
FIG. 8 is a plan view of the housing base of FIGS. 7A and 7B with functional links bridging the connectors.

FIG. 8 shows the housing base 104 after coupling the connectors 156 via a set of functional links 196 in the same configuration as shown in FIG. 4. The functional links 196 include three connector links 200, each coupled to each of an opposing pair of connectors 156 via a bolt 204. The connector links 200 are covered with a dielectric coating across most of their surface area apart from where contact is made with the connectors 156. The dielectric coating reduces the probability of arcs between the connector links 200 and other components having a different voltage potential. An SVL link 206 is also coupled to the bolt 204 at one end of each of the connector links 200. The SVL links 206 are a set of bars with a flanged end positioned towards the center of the link box 100. An SVL 208 is secured to the flanged end of each SVL link 206. Also coupled to each SVL 208 on the side of the SVL 208 opposite of the SVL links 206 is a crossbar 212 that is coupled to the connector 156 serving as a ground connector.

Depending on the configuration for the link box 100, the functional links can vary significantly. For example, the functional links can include one or more of cross-bonding links, SVLs, etc. configured so that the type of the link box can be cross bonding, grounding, SVL, or SVL and grounding. The functional links and connectors may also be configured so that the link box connects to between one and six bonding leads. The particular embodiment of FIG. 8 shows the link box configured as a cross bonding type that connects to six bonding leads.

A planar phase separator 216 is inserted when required into opposing separator channels 146 formed by the separator guide supports 145 between the functional links 196 for each phase. The phase separators 216 act as an electrical separation structure interposed between and fully electrically isolating at least one phase from at least another phase in the interior space 128, and are made from a material that has high electrical insulation properties to inhibit the generation of an arc between the functional links of different phases, for example, glass polyester or any other suitably non-conductive material. Each phase separator 216 can have one or more slots through which the SVL grounding crossbar 212 can be installed. Multiple slots can be provided in each phase separator 216 to facilitate multiple configurations of the link box and resulting locations of the crossbar 212. In the illustrated embodiment, two pairs of opposing separator channels allow for up to two planar phase separators 216 to be inserted between the functional links 196 for each phase, a combined total of up to four planar phase separators 216 per link box. The phase separators 216 effectively increase the electrical insulation between the components of separate phases. By allowing zero, one, or two planar phase separators 216 to be inserted between each pair of phases, the same size of enclosure may be configured for a range of possible different voltage requirements. The size of the link box is thus minimized for higher voltage ratings. Moreover, the cost of the link box is optimized because the same enclosure design may be applied in multiple link box configurations and voltage ratings, resulting in a lower cost per unit.

In an alternative embodiment, the housing of the link box may be constructed or may include other inserts to create discrete, electrically isolated phase compartments. The housing and/or the inserts can thus act as an electrical separation structure that is interposed between phases in the interior space of the sheath-bonding link box. By separating the enclosure into discrete, electrically insulated phase compartments, the electrical insulation levels of the phase separation devices can be increased for higher voltage SVL applications, such as, for example, up to 30 kV.

Referring now to FIGS. 4 and 8, once the functional links 196 and the SVLs 208 have been assembled, the phase separators 216 have been set, and the large o-rings have been positioned in the annular grooves 139, the housing cover 108 can be placed atop of the flange 120 between the flange lip 124 and secured to the housing base 104 via a set of bolts inserted through the bolt holes in the housing cover 108 and the bolt holes 138 in the housing base 104 and torqued to compress the large o-rings to seal the interior space 128.

It will be appreciated that the design of the link box 100 of FIGS. 4 to 8 enables a smaller set of configurations to provide the same functionality as provided by a larger set of conventional sheath-bonding link boxes.

Figure 9A:
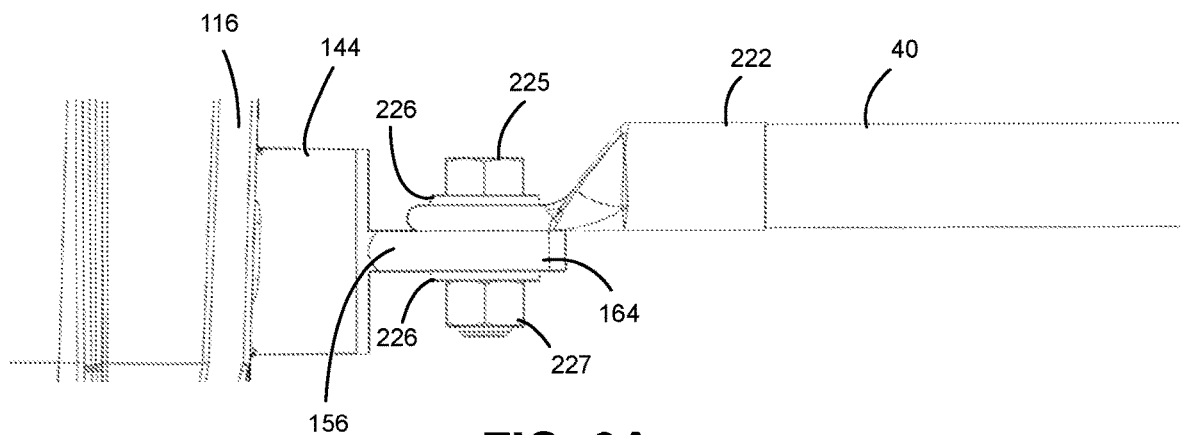
FIG. 9A shows the port and connector of FIGS. 6A and 6B after connecting a bonding lead to the connector.

FIG. 9A shows the connection of a bonding lead 40 to the link box 100. The jacket 92 and the insulation 88 are stripped from the end of the bonding lead 40 to expose the conductor 64. The conductor 64 is fitted with a lug, such as, for example, a compression bonding-lead lug 222 using an appropriate tool. The bonding-lead lug 222 is then secured to the external portion 164 of the connector 156 using a bolt 225 inserted through a washer 226 and the bolting aperture 172, and secured in place with a washer 226 and nut 227.

Figure 9B:
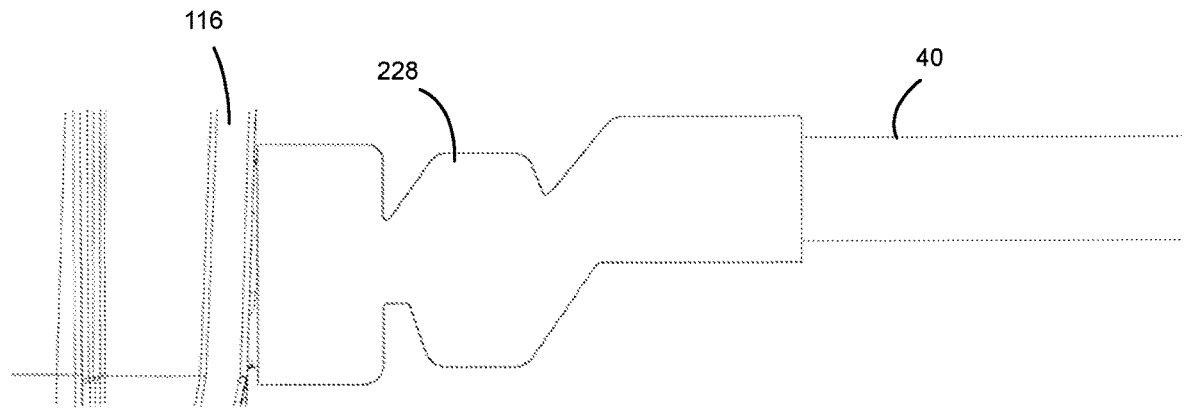
FIG. 9B shows the port and connector connected to a bonding lead of FIG. 9A with a heat-shrink tubing fit thereover.
Figure 9C:
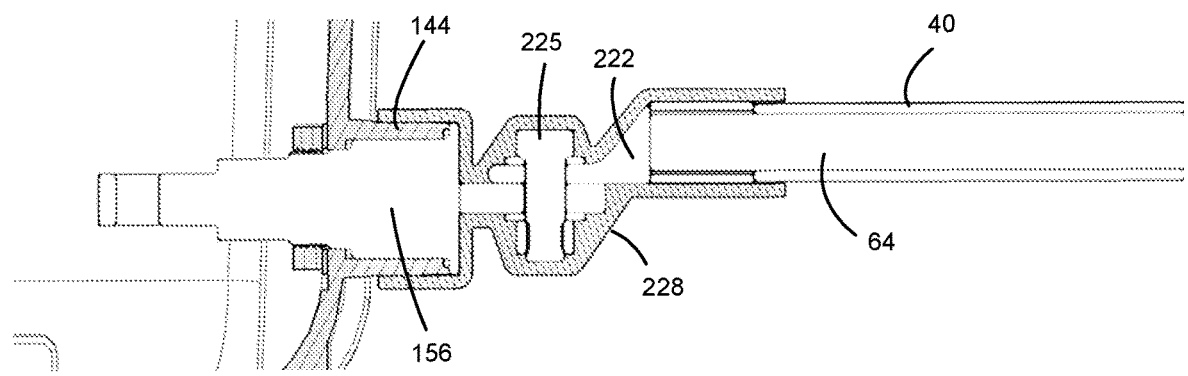
FIG. 9C shows a section view of the connector secured within the port and connected to the bonding lead with the heat-shrink tubing fitted thereover.

As shown in FIGS. 9B and 9C, once the conductor 64 is secured to the bolt 225, a sealing member in the form of a length of electrically insulating heat-shrink tubing 228 is slid over the exposed bonding-lead lug 222 and the connector 156. Alternatively, cold-shrink tubing may be employed in place of the heat-shrink tubing. Heat is applied to seal the heat-shrink tubing 228 over the connection. This is one example of how the connection between two metallic parts may be sealed to prevent contact with moisture and resulting corrosion but other means may also be used, involving, for example, a casing, mastic tape, etc. The failure of a sealing member positioned over a connector 156 and the bonding-lead lug 222 of one phase to which the connector 156 is connected will not expose the connector 156 and the bonding-lead lug 222 to other connectors 156 and bonding-lead lugs 222 of other phases. That is, a dielectric barriers in the form of the sealing members positioned over the connectors 156 and the bonding-lead lugs 222 of the other phases prevent exposure to the connector 156 and the bonding-lead lug 222 with a faulty sealing member to thereby prevent arc flashes or currents therebetween.

By making the bonding lead connections external to the link box, inspection and associated testing of the sheath bonding is simplified. With conventional link boxes, the link box is opened and links and cross-links between different phases may be manipulated, the link box is closed, and a test is performed. Once the test is completed, the links and cross-links are typically restored to their pre-test state and the link box is closed. Each time the link box is opened and closed, there is a chance that the internal links are not returned to the proper operational configuration, or closing of the link box may not be performed as required. For example, the bolts securing the link box cover to the housing base may not be torqued sufficiently, thus compromising the seal. Alternatively, the bolts may be over-torqued, which can lead to a degradation of the seals due to over-compression.

With the link box 100, in order to test the sheath bonding, the heat-shrink tubing 228 is removed so that the bonding leads 40, fitted with bonding-lead lugs 222, can be unsecured from the connectors 156. The bonding leads 40 can then be directly coupled to each other or testing equipment directly. Once the testing is complete, the bonding leads 40 are re-secured to the connectors 156 and new heat-shrink tubing is sealed over each connection between the link box 100 and the bonding leads 40. In the case of a failure of the seal over the connection using the heat-shrink tubing 228, water will not enter the link box 100, unlike for prior art link boxes that rely on the gland and heat-shrink tubing to seal the link box itself.

Further, as the housing cover 108 is made of an at least partially transparent material, the field of view of the internals of the link box 100 is improved.

Alteration of the cross-bonding arrangement between bonding leads of different phases can be performed with the link box 100 in the illustrated configuration or in alternative functional link configurations without opening the link box by coupling the bonding leads 40 to different connectors 156.

Figure 10:
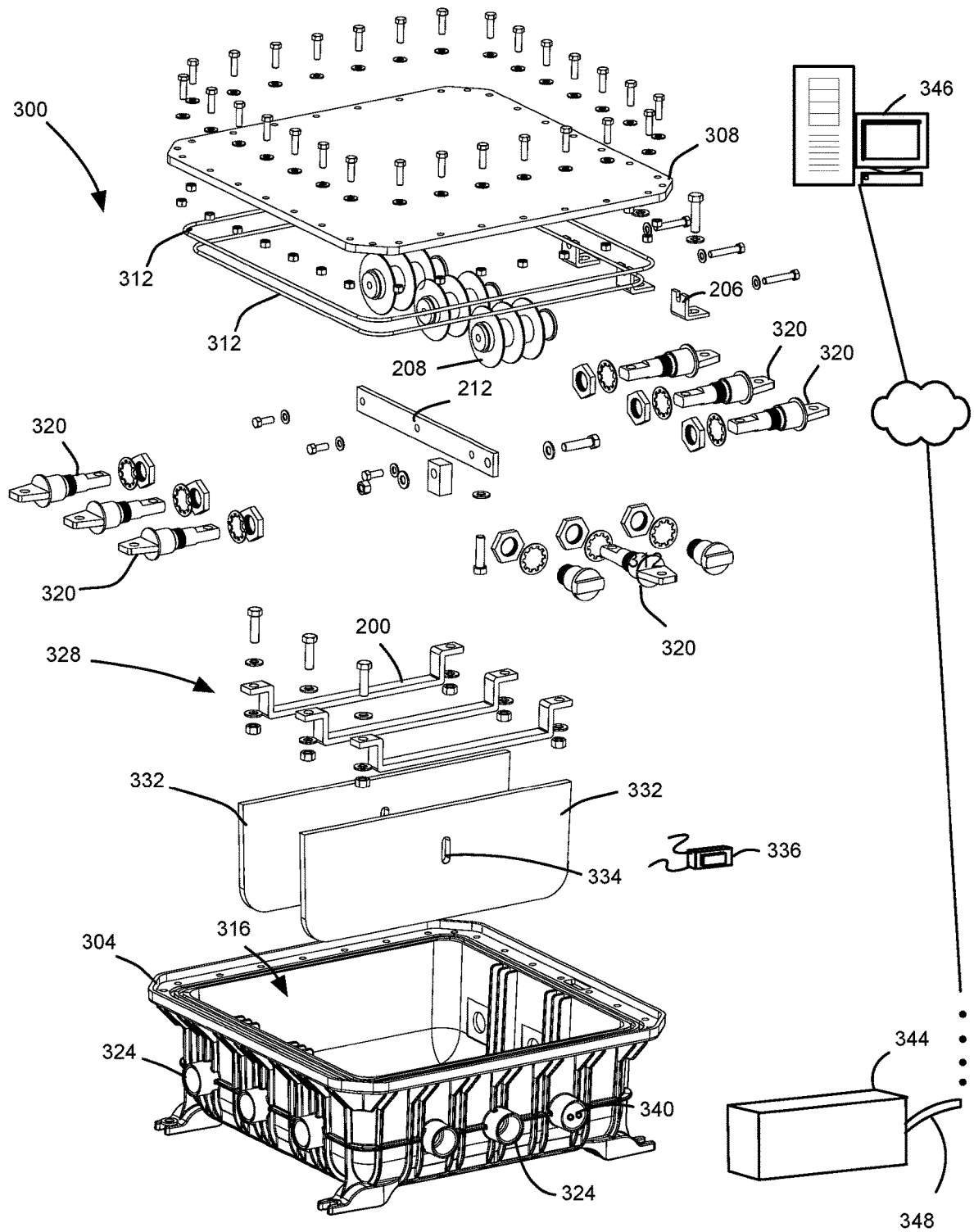
FIG. 10 is an exploded view of the link box of FIGS. 4 to 9C having a sensor module in communication with a control module in accordance with another embodiment.

FIG. 10 shows a link box 300 in accordance with another embodiment. The link box 300 is similar to the link box 100 of FIGS. 4 to 9B, except that the link box 300 houses one or more sensors to detect and register conditions within the link box 300 and in the sheath bonding system. A monitoring module receives the sensor data from the sensors and communicates the sensor data to a control center distal from the link box 300.

As shown, the link box 300 has a housing base 304 and a housing cover 308 that form a housing. A pair of large o-rings 312 positioned in annular grooves in a flange of the housing base 304 enable the housing cover 308 and the housing base 304 to form a seal therebetween, sealing an interior space 316 of the link box 300. A set of connectors 320 are secured within connector ports 324 in the housing base 304. A set of functional links 328 are coupled to the connectors 320 within the housing base 304. The functional links 328 can be any known configuration of functional links available. A pair of phase separators 332 are positioned in the link box 300 between the functional links 328 of different phases. In other embodiments, two pairs of phase separators or no phase separators 332 may be positioned in the link box 300 between the functional links 328 of different phases. The phase separators 332 are shown each having a single slot 334 for accommodating a grounding crossbar.

A sensor module 336 including one or more sensors is secured within the housing base 304 of the link box 300 and includes a set of leads coupled to various components as desired to register sensor data, such as, for example, the current along each bonding lead 40, the phase voltage of each bonding lead 40, etc. The sensor module 336 is coupled to a communications interface 340 that is sealed inside the housing. The communications interface 340 is exposed via a connector port 324, and includes power and data pins. The sensor module 336 is passive in that it draws power via the connector port 324. A control module 344 is coupleable to and sealable against the communications interface 340 to provide power to the sensor module 336 and to receive sensor data from the sensor module 336. The control module 344 has a communications module for communicating sensor data received from the sensor module 336 to one or more remote computing devices 346 for remote monitoring via a cable bundle 348. The cable bundle 348 is also connected to a power source such as a device that harvests power from the power transmission lines to draw power for the control module 344 that, in turn, provides power to the sensor module.

The link box 300 enables remote monitoring of the conditions within the link box 300 and the condition of the sheath bonding system, and communicates these conditions to a remote computing device. This enables near real time monitoring of the condition of the sheath bonding system, thereby reducing the frequency with which workers need to inspect the link boxes.

In an alternative embodiment, the sensor module and/or the control module can harvest power from the bonding leads to power their operation. In a further embodiment, the sensor module and/or the control module can be battery-powered. In a still further embodiment, the control module 344 may communicate the sensor data wirelessly to one or more nearby data acquisition device or to one or more remote computing devices 346 via radio frequency, cellular, or other wireless communication technology, such as infrared light transmitted through an at least partially transparent portion of the housing.

Figure 11A:
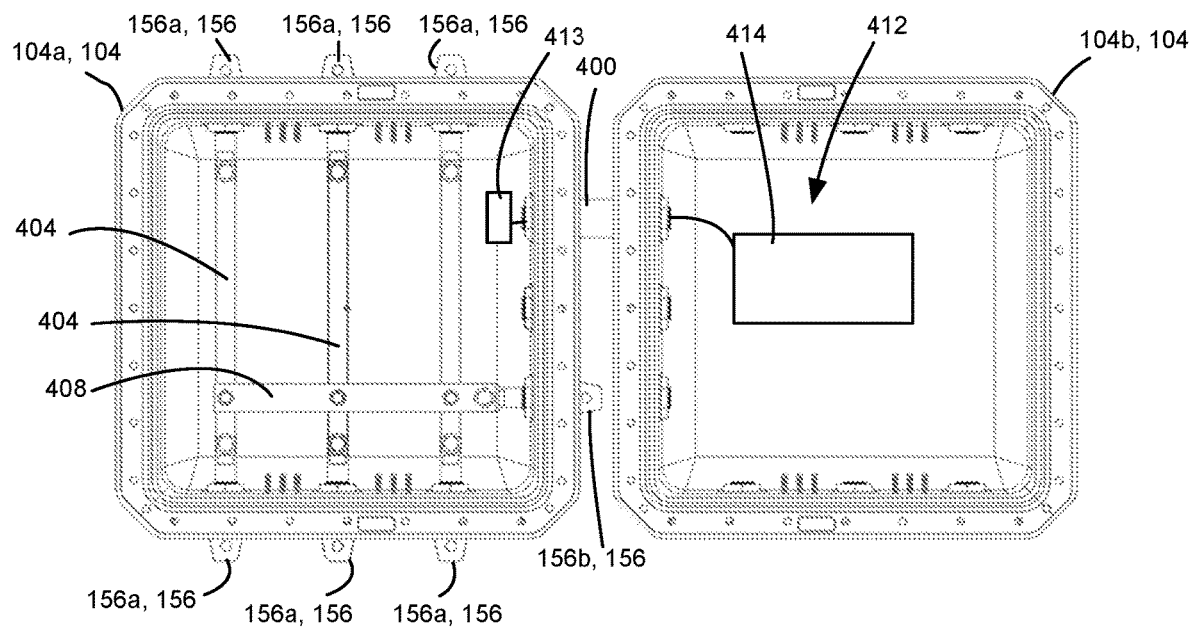
FIGS. 11A and 11B are plan and side elevation views of two link box housing bases of FIGS. 5A to 5D coupled together to form a single enclosure.
Figure 11B:
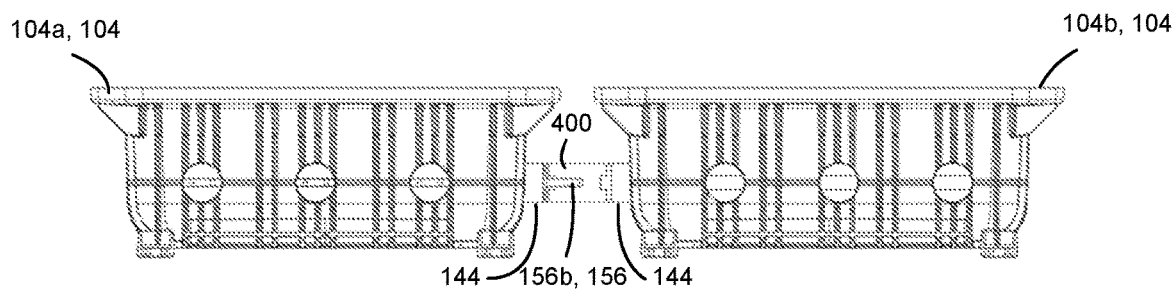

FIGS. 11A and 11B show a different configuration of the link box housings of FIGS. 4 to 8. The housing bases 104 are shown with the housing covers 108 removed. A first of the housing bases 104a has a set of connectors 156 secured within seven of the connector ports 140: six arranged in three pairs of opposing connectors 156a for coupling to bonding leads 40, and a seventh ground connector 156b for coupling to a ground. An eighth connector port 140 is sealed with a sealing cap 186. The housing base 104a is a grounding link box and has a set of grounding links 404 coupling each of the three pairs of connectors 156a. A crossbar 408 is coupled to each of the grounding links 404 and the ground connector 156b.

The two housing bases 104a, 104b are coupled together via a housing coupler 400. The housing coupler 400 is a tubular element that is sealed to both of the connector sleeves 140 of the housing bases 104a, 104b. Referring to the link box 100 shown in FIGS. 7A and 7B, the housing coupler 400 replaces one of the sealing caps 186 shown secured to the connector sleeve 144 for the link box 100a. The other connector ports 140 of the second housing base 104b can be equipped with seven sealing caps 186 and a communications interface, such as the communications interface 340 of FIG. 10.

A sensor module 413 is positioned in the housing base 104a and is coupled via a wire interface extending through the housing coupler 400 to a control module 414 positioned in the other housing base 104b. The control module 414 includes a communication module for communicating sensor data received from the sensor module 413 to a remote computing device to enable remote monitoring of the enclosure and thus the power transmission system. In this manner, a larger set of components can be properly sealed within the enclosure.

Figure 11C:
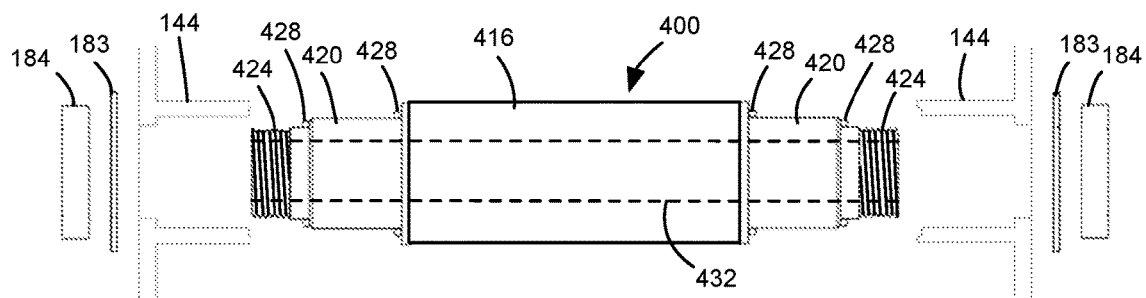
FIG. 11C shows a housing coupler used to couple two housing bases of FIGS. 5A to 5D together to form a single enclosure.

FIG. 11C shows the housing coupler 400 in greater detail. The housing coupler 400 includes a bridging tube 416, from each axial end of which extends a tubular sleeve insert 420 that is dimensioned to fit snugly within the connector sleeves 144. A tubular threaded portion 424 extends axially from each sleeve insert 420. O-rings 428 are fitted around shoulders between the bridging tube 416, the sleeve inserts 420, and the threaded portion 424. A through-hole 432 extends through the housing coupler 400 between axial ends thereof. The housing coupler 400 is sealably coupled at each axial end to a connector port much in the same manner as with the connectors 156, with the threaded portion being received by and passing through the connector port 140. A locking washer 183 and nut 184 are secured around the threaded portion 424 from within the housing base 104, thereby compressing the o-rings 428. When both axial ends of the housing coupler 400 are secured within two housing bases 104, the housing coupler 400 forms a channel between the housing bases 104 to enable them, when housing covers are sealed thereon, to form a single enclosure. The volume of an interior space 412 defined by the enclosure is effectively doubled over that afforded by a single link box 100.

In an alternative embodiment, one of the connector sleeves of the housing base 104 can be elongated to provide the functionality of the housing coupler. The elongated housing sleeve can be sealable via a cap or other suitable means to seal the housing, and can alternatively be sealably coupled to the port of another housing to form a single enclosure from the two housings.

The additional interior space 412 can be used to house a control module such as the control module 344 of FIG. 10 that is positioned in the second housing base 104b. The control module can be coupled to a sensor module that is positioned in the first housing base 104a. As a result, a control module including sensitive components that is not specifically built to seal within the housing base 104a can be sealed within the second housing base 104b so that it can be coupled to the sensor module via one or more cables, wireless communications, etc. An adapter can then be used to couple the control module to the communications interface bridging between the interior space 412 and the exterior of the link box 100b so that it can be coupled to communications cables, a power source, etc.

Additionally, the additional interior space 412 afforded by the two housings coupled together distributes the rapid pressure rise from an arc flash event over a larger region, thus reducing the force exerted on each portion of the combined housing.

Figure 12A:
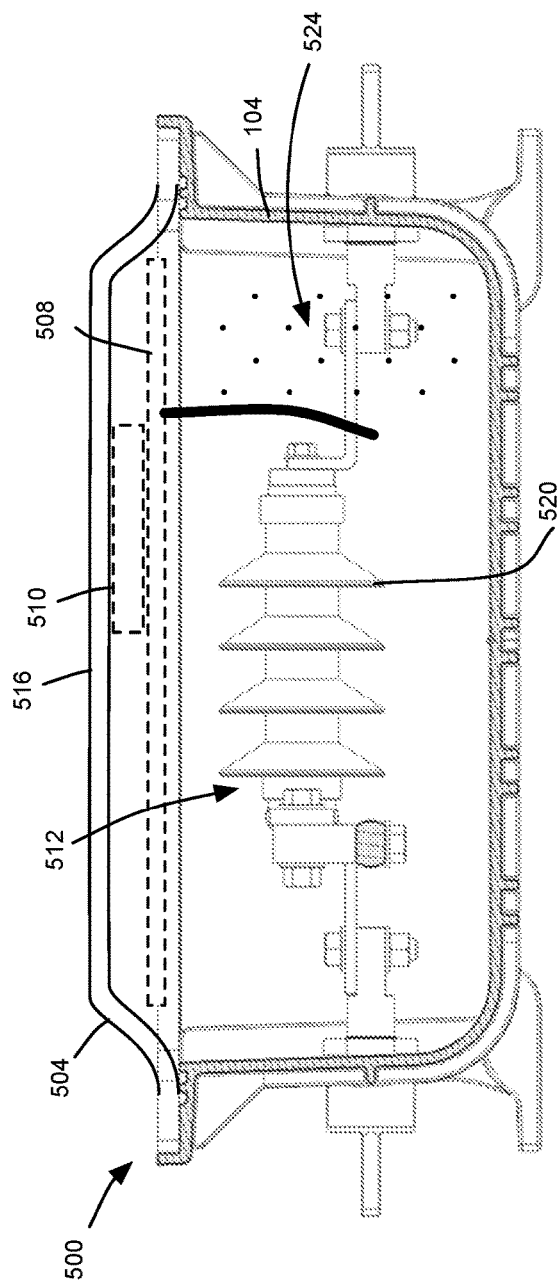
FIG. 12A is a side section view of a sheath-bonding link box in accordance with another embodiment, wherein monitoring components are located in a cover thereof.

FIG. 12A shows a link box 500 that is a variant of the link box 100 of FIGS. 4 to 8. The link box 500 includes the same housing base 104 that is capable of housing the same functional links between connectors deployed in connector ports of the link box 500. In this FIG. 12A, the functional links are shown in a different configuration providing an SVL and grounding type link box that connects to six bonding leads.

A housing cover 504 of the link box 500 has a raised, thicker profile than the housing cover 108 of the link box 100 of FIG. 4, and houses or covers a control module 508 attached to components of the housing base 104. The control module 508 can include, for example, a circuit board, power components, a display, a wireless module, etc. The power components can include, in some cases, a battery to power the control module 508 and/or the sensor module. In a preferred embodiment, the housing cover 504 includes a separate water-tight battery compartment for housing one or more batteries 510 that can be changed without removing the housing cover 504 of the link box 500 from the housing base 104. The one or more batteries either power the control module 508 and/or the sensor module via inductive power transfer or via a set of leads that extend through the polycarbonate so that the battery compartment is sealed from an interior space 512 of the link box 500. In other cases, the power components might include components for harvesting power from the functional links coupled to the bonding leads. A sensor module can also be included in the housing cover 504, or can be connected to the control module 508 via a set of leads. The control module 508 can be coupled to a communications interface positioned in a connector port that is then, in turn, coupled to external power and communication lines.

Figure 12B:
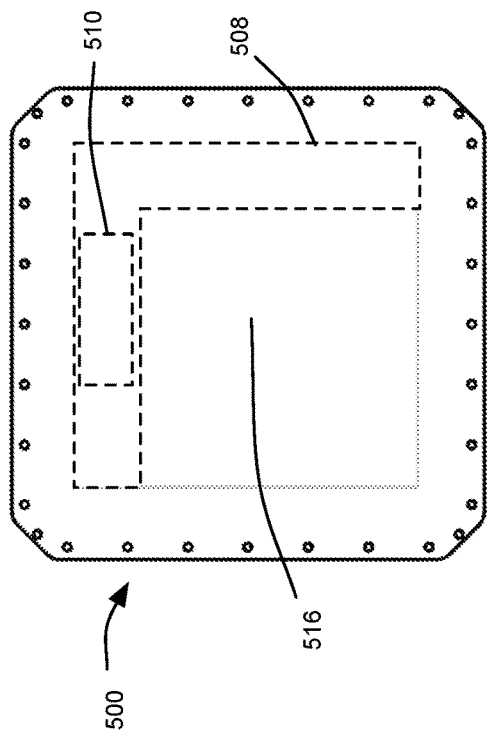
FIG. 12B illustrates a top view of the cover of FIG. 12A.

The housing cover 500 is made of a material that is at least partially transparent, such as a clear polycarbonate. Where the control module 508 and or sensor module are built into the housing cover 500, the control module 508 and/or the sensor module can be located within the housing cover 500 so that a view of the interior space 512 of the link box 500 via a central viewing region 516 is generally unobstructed, as shown in FIG. 12B. In this manner, components such as an SVL 520 can be viewed without removing the housing cover 504 from the housing base 104.

Additionally, a pressurized inert gas 524, such as sulfur hexafluoride, can be injected into the interior space 512 of the link box 500 as it is being sealed to improve the electrical insulation within the link box 500.

Figure 12C:
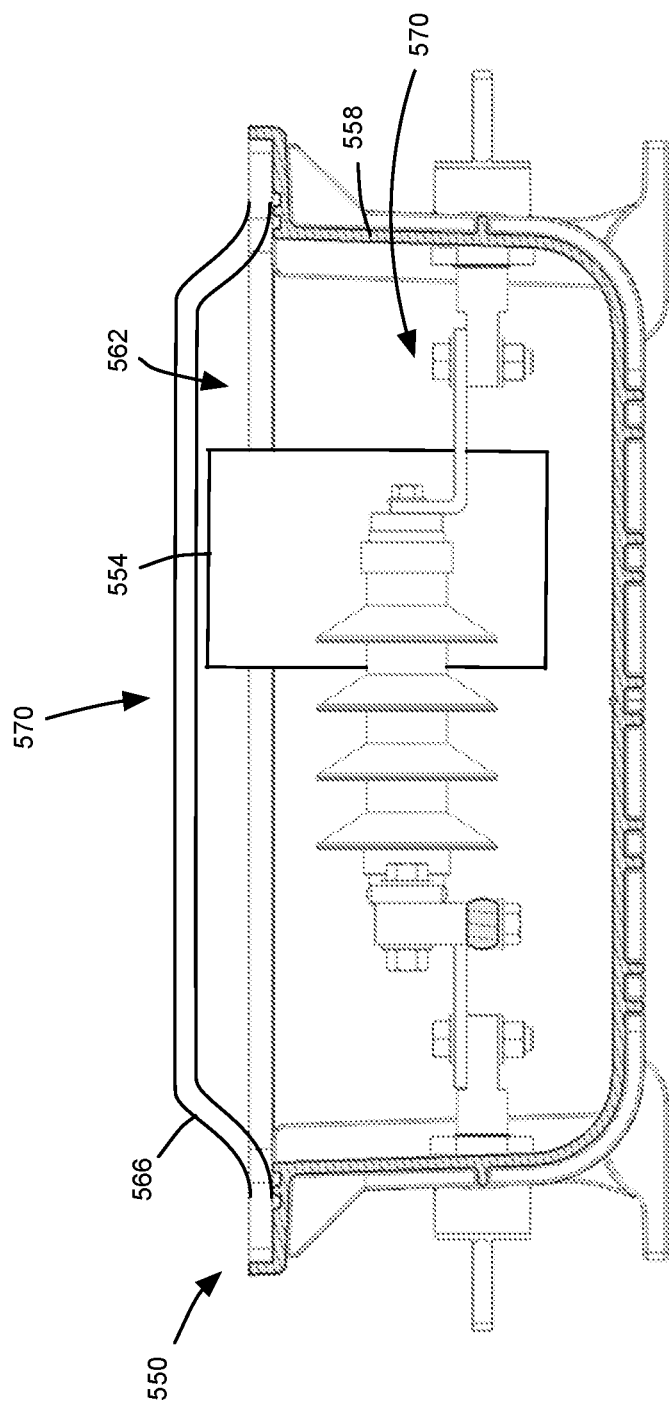
FIG. 12C illustrates a side section view of a sheath-bonding link box in accordance with a further embodiment, wherein monitoring components secured in a housing base extend into head space afforded by an expanded housing cover.

FIG. 12C shows a sheath-bonding link box 550 in accordance with a further embodiment, wherein monitoring components 554 secured in a housing base 558 extend into head space 562 afforded by an expanded housing cover 566. The housing cover 566 extends away from the housing base 558 to which the housing cover 566 is secured towards a middle region 570 of the housing cover 566. The housing cover 566 is molded from an at least partially transparent polymer, facilitating the manufacture of its expanded form. The headspace 562 afforded by the housing cover 566 enables larger components to be encapsulated by the enclosure.

Figure 13:
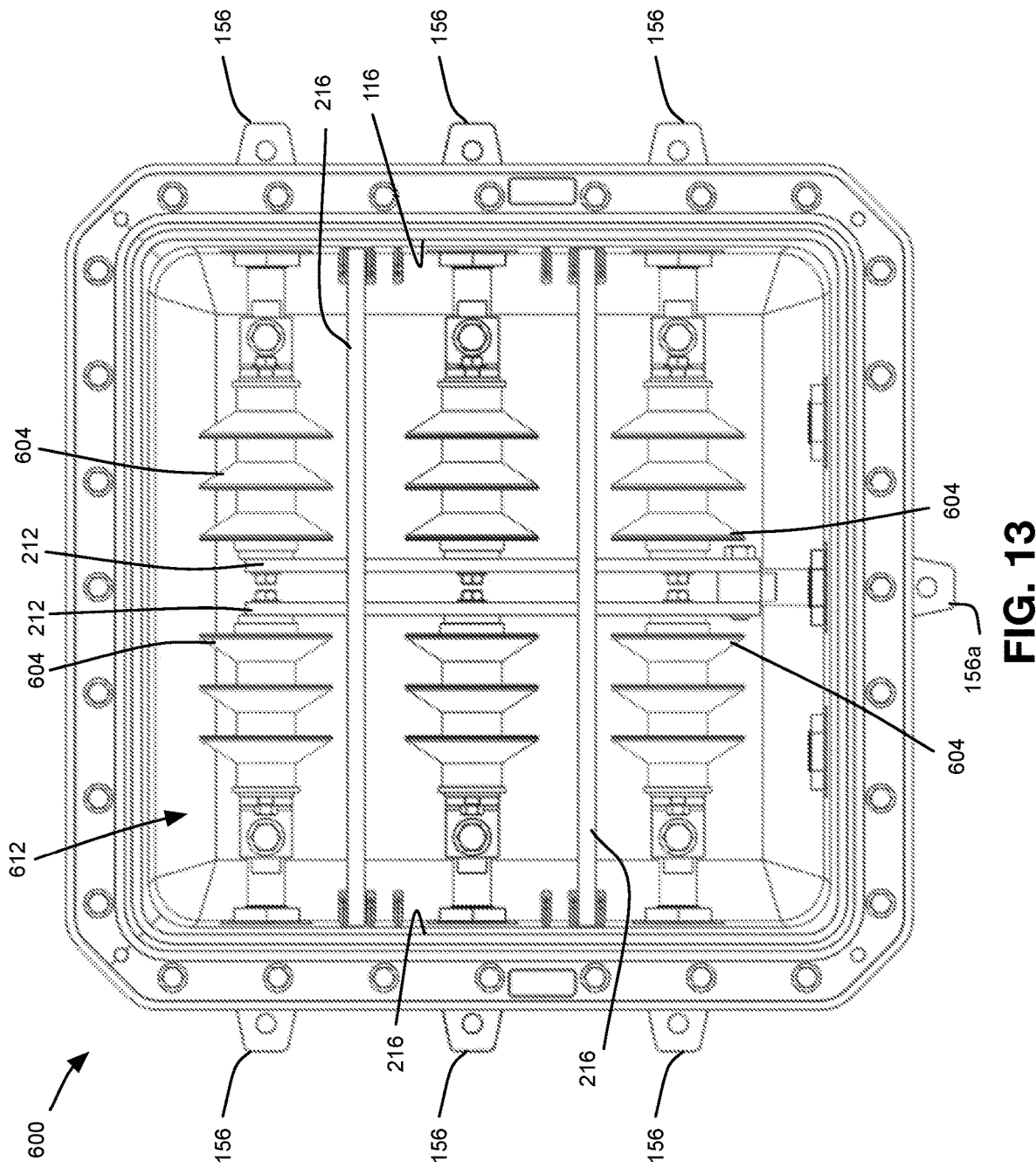
FIG. 13 is a plan view of the sheath-bonding link box of FIGS. 4 to 8 with a different functional link configuration.

FIG. 13 shows a link box 600 similar to that of the link box 100 of FIGS. 4 to 8 that has been configured with different functional links. In particular, each of the three pairs of connectors 156 secured in the connector ports of opposing side walls 116 are coupled to SVL links 206 that are, in turn connected to an SVL 604. Each of the six SVLs 604 is coupled to one of two crossbars 212 that extend across to a ground connector 156a. Two phase separators 216 have been positioned between the pairs of SVLs 604 to effectively increase the clearance afforded to each of the six phases.

As will be apparent, the link box 600 effectively replaces the functionality provided by the two link boxes 44e and 44f of FIG. 1. That is, the insulating characteristics of the link box 600 having a non-metallic enclosure with the phase separators 216 inserted between the components of the different phases and/or the inert gas injected therein enables placement of these components in a smaller space than would otherwise be possible with a conventional link box.

Figure 14A:
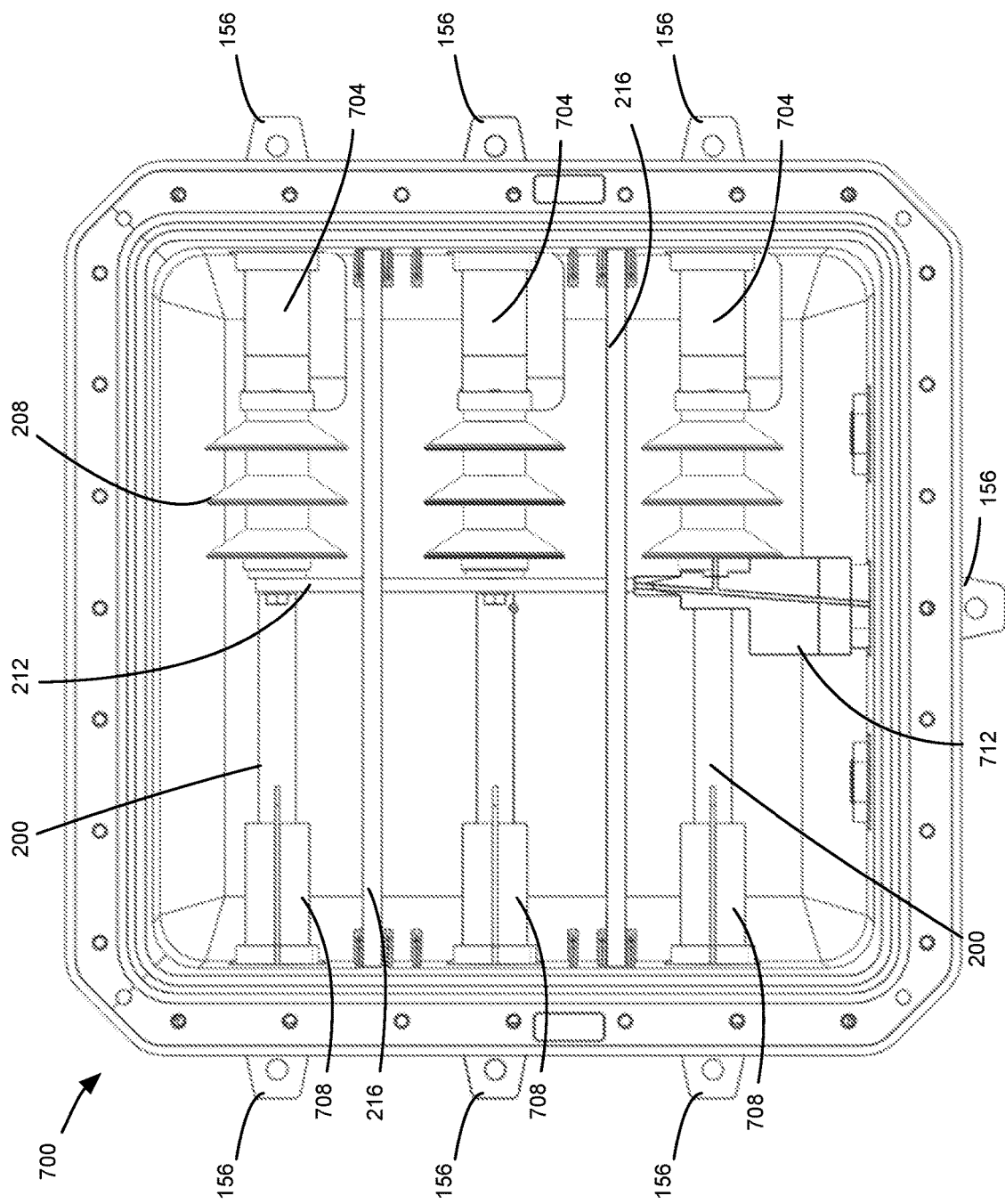
FIGS. 14A and 14B are plan and perspective views of the sheath-bonding link box of FIGS. 4 to 8, wherein bus boots are deployed over the SVL links and the ground link.
Figure 14B:
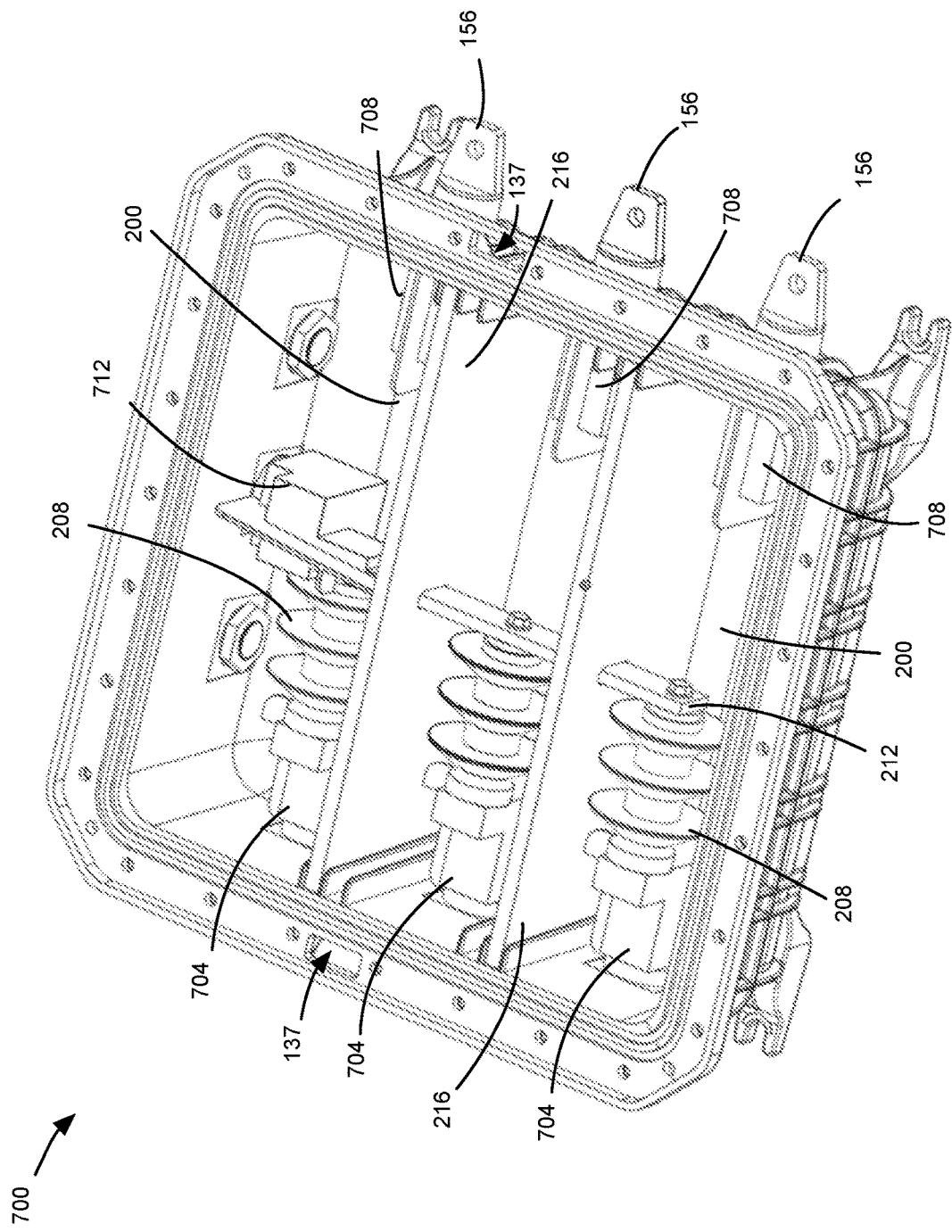

FIGS. 14A and 14B show another link box 700 that is similar to the link box 100 shown in FIG. 8, wherein some components have been electrically insulated. In the link box 100 of FIG. 8, the internal portions 160 of the connectors 156, the bolts 204 coupling the connectors to the connector links 200 and SVL links 206, the crossbar 212, and the ground bushing between the crossbar 212 and the ground connector 156 are all exposed. In order to enable the link box 700 to be rated for higher voltages, bus connector insulating boots (bus boots) 704, 708, 712 are secured over some of these components to further electrically isolate the different phases from each other and from ground. In particular, bus boots 704 are deployed over the connectors 156 adjacent the SVLs 208, the SVL links 206, and the bolts 204 coupling these components together. Bus boots 708 are deployed over the connectors 156 distal from the SVLs 208 and the bolts 204 coupling them to the insulated connector links 200. Further, bus boot 712 is deployed over the ground connector 156 and a portion of the crossbar 212 to which the ground connector 156 is coupled. Thus, the only conductive component that is exposed in the enclosure is the crossbar 212.

The bus boots 704, 708, 712 can be applied in any suitable manner, such as fitting and securing pre-molded dielectric insulation over components, applying a dielectric coating to components, etc., and provide an electrical separation structure between phases and to ground within the interior space of the link box 700.

By further isolating the conductive components, the link box 700 is equipped to handle higher operating and transient voltages.

Figure 15:
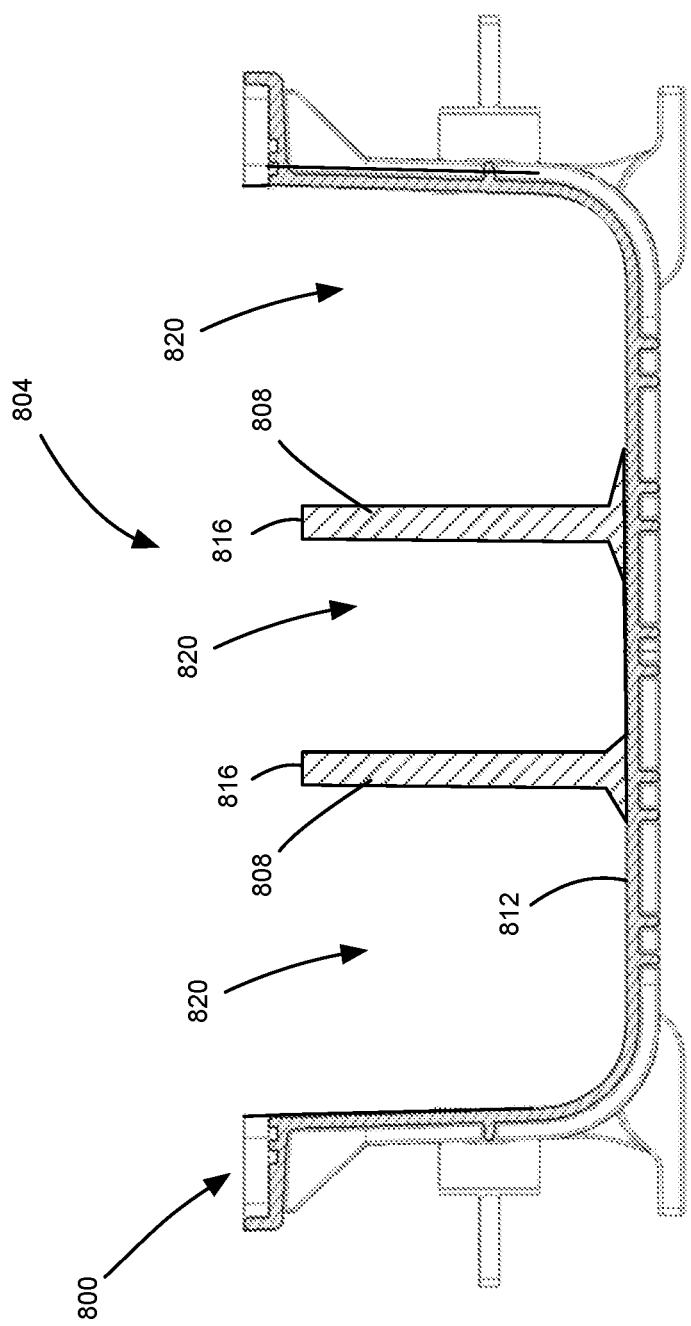
FIG. 15 is a side section view of a housing base for a sheath-bonding link box in accordance with another embodiment, wherein the housing base provides an integral electric separation structure.

FIG. 15 shows a housing base 800 of a link box in accordance with another embodiment that is molded so as to provide an integral electrical separation structure 804. The housing base 800 is formed from a dielectric material, such as an injection molded polymer. The electrical separation structure 804 includes a pair of interior walls 808 that extend vertically from a floor 812 of the housing base 800 to a top end 816 that meets and seals against a housing cover (not shown) that is secured to the housing base 800. The housing cover is a flat panel that is also made from a dielectric material. The interior walls 808 span the entire width of the housing base 800 so as to form three electrically isolated and discrete compartments 820 within the link box when the housing cover is positioned on the housing base 800. When functional links of different phases are operably positioned within the link box, the interior walls 808 are interposed between them.

Other methods of providing electrical separation structures that are interposed between a first phase and at least one of a second phase and a ground connection in an interior space of a sheath-bonding link box will be apparent from the teachings herein.

The link boxes can be employed to bond sheaths in both alternating and direct current systems.

Although specific advantages have been enumerated above, various embodiments may include some, none, or all of the enumerated advantages.

Persons skilled in the art will appreciate that there are yet more alternative implementations and modifications possible, and that the above examples are only illustrations of one or more implementations. The scope, therefore, is only to be limited by the claims appended hereto.

LIST OF REFERENCE NUMERALS 20 power transmission system
24 power transmission lines
28 cable section
32, 32a to 32f cable joint
36, 36a to 36g sheath section
40 bonding lead
42 ground continuity conductor
44, 44a to 44g link box
48, 48a, 48b ground connections
52 housing base
56 functional link
60 bond lead terminal
64 conductor
68 cross-bonding link
72 sheath voltage limiter
76 cross bar
80 ground cable conductor
84 gland
85 sealing nut
86 port
88 insulation
92 jacket
100, 100a, 100b link box
104 housing base
108 housing cover
112 floor
116 sidewall
120 flange
124 flange lip
128 interior space
130 mounting feet
132 curved section
136 rib
136a longitudinal rib
136b circumferential rib
137 cover release opening
138 bolt holes
139 annular groove
140 connector port
144 connector sleeve
145 separator support
146 separator channel
148 annular ledge
152 inner annular channel
156, 156a, 156b connector
160 internal portion
164 external portion
168 bolting aperture
172 bolting aperture
176 central portion
180 o-ring
181 o-ring
182 threaded portion
183 locking washer
184 nut
186 sealing cap
188 external surface
196 functional link
200 connector link
204 bolt
206 SVL link
208 SVL
212 crossbar
216 phase separator
218 slot
220 o-ring
222 bonding-lead lug
224 sleeve
225 bolt
226 washer
227 nut
228 heat-shrink tubing
232 internal threading
300 link box
304 housing base
308 housing cover
312 large o-ring
316 interior space
320 connector
324 connector port
328 functional link
332 phase separator
334 slot
336 sensor module
340 communications interface
344 control module
346 remote computing device
348 cable bundle 400 housing coupler
404 grounding link
408 crossbar
412 interior space
413 sensor module
414 control module
416 bridging tube
420 sleeve insert
424 threaded portion
428 o-ring
432 through-hole
500 link box
504 housing cover
508 control module
510 battery
512 interior space
516 central viewing region
520 SVL
524 inert gas
550 sheath-bonding link box
554 monitoring components
558 housing base
562 head space
566 housing cover
600 link box
604 SVL
700 link box
704 bus boot
708 bus boot
712 bus boot
800 link box
804 housing base
808 mounting foot
812 floor
D distance
MS mounting surface

The invention claimed is:

1. A sheath-bonding link box, comprising:
a housing forming an enclosure defining a watertight sealed interior space; and
a set of electrically conductive connectors extending through the housing between an exterior of the enclosure and the interior space, the set of connectors each having an internal portion positioned inside of the interior space and an external portion positioned outside of the enclosure, the internal portion being electrically connectable to a functional link in the interior space, the external portion being dimensioned to be electrically connectable to a sheath-bonding lead.

2. The sheath-bonding link box of claim 1, wherein the housing is made of a dielectric material.

3. The sheath-bonding link box of claim 2, wherein the housing is at least partially made from an at least partially polymeric material.

4. The sheath-bonding link box of claim 1, wherein the connectors are releasably secured to the housing to enable reconfiguration of the sheath-bonding link box.

5. The sheath-bonding link box of claim 4, wherein the connectors are sealably secured to the housing via at least one o-ring.

6. The sheath-bonding link box of claim 4, wherein each of the set of electrically conductive connectors is operably electrically connectable to a conductor of a single-phase sheath-bonding lead.

7. The sheath-bonding link box of claim 6, further comprising a sealing member positioned over each of the set of electrically conductive connectors and the conductor of the single-phase sheath-bonding lead to which it is connected to seal the electrically conductive connector and the conductor of the single-phase sheath-bonding lead.

8. The sheath-bonding link box of claim 1, wherein the housing includes a set of connector support structures, through which the set of electrically conductive connectors extend, wherein at least one of the set of connector support structures is configured to be coupled to and sealed watertightly with a corresponding connector support structure of another housing to form a single enclosure.

9. The sheath-bonding link box of claim 1, further comprising an electrical separation structure interposed between and fully electrically isolating a first phase and at least one of a second phase and a ground connection in the interior space of the sheath-bonding link box.

10. The sheath-bonding link box of claim 9, wherein the electrical separation structure includes at least one dielectric phase separator that is releasably securable within the interior space of the housing.

11. The sheath-bonding link box of claim 10, wherein the housing includes at least a pair of opposing channels within the interior space for retaining the at least one phase separator.

12. The sheath-bonding link box of claim 9, wherein the electrical separation structure comprises a dielectric insulation applied to at least one component.

13. A sheath-bonding link box, comprising a housing defining a sealed interior space, the housing being primarily comprised of a dielectric material, wherein the housing has at least one rib extending along an exterior surface thereof to mechanically strengthen the housing to resist rupturing of the housing as a result of an internal pressure surge, wherein the housing has at least one other rib extending along the exterior surface thereof, the at least one other rib extending one of obliquely and normal to the at least one rib.

14. The sheath-bonding link box of claim 13, wherein the dielectric material is an at least partially polymeric material.

15. The sheath-bonding link box of claim 14, wherein the dielectric material includes a stiffening additive.

16. The sheath-bonding link box of claim 14, wherein the housing comprises at least a first housing portion and a second housing portion that seal along abutment surfaces thereof to cooperatively form the housing, wherein at least the first housing portion is molded to have at least one annular groove on the abutment surface thereof, and wherein an o-ring is positioned in the at least one circumferential channel between the first and second housing portions to seal therebetween.

17. The sheath-bonding link box of claim 13, wherein the housing includes an at least partially transparent housing cover spanning over the entire sealed interior space.

18. The sheath-bonding link box of claim 17, wherein the at least partially transparent housing cover is an at least partially polymeric panel secured to a housing base.

19. The sheath-bonding link box of claim 13, wherein the housing has at least one circumferential rib extending circumferentially about the housing.

20. The sheath-bonding link box of claim 13, further comprising an electrical separation structure interposed between a first phase and at least one of a second phase and a ground connection in an interior space of the sheath-bonding link box.

21. The sheath-bonding link box of claim 20, wherein the electrical separation structure includes at least one dielectric phase separator releasably securable within the interior space of the housing.

22. The sheath-bonding link box of claim 21, wherein the housing includes at least a pair of opposing channels within the interior space for retaining the at least one phase separator.

23. The sheath-bonding link box of claim 21, wherein the at least one dielectric phase separator is at least two dielectric phase separators positioned between the first phase and the second phase within the interior space of the sheath-bonding link box, and wherein the housing includes at least two pairs of opposing channels within the interior space for retaining the at least two dielectric phase separators.

24. A sheath-bonding link box, comprising:
   a housing defining a sealed interior space, wherein the housing includes at least one external port; and
   a housing coupler sealably coupleable to or extending from one of the at least one external port of the housing at a first end thereof, and sealably coupleable to a corresponding one of the at least one external port of another housing at a second end thereof, the housing coupler having a through-hole extending from the first end to the second end thereof, wherein a single enclosure is formed when the housing coupler is coupled to or extends from the housing and is coupled to the other housing.

25. The sheath-bonding link box of claim 24, wherein the housing is coupled to another housing via the housing coupler, the sheath-bonding link box further comprising:
   at least one sensor positioned inside the interior space and coupled to a control module positioned in the other housing via the housing coupler to communicate sensor data received from the at least one sensor via a communications network to a remote computing device.

26. A sheath-bonding link box, comprising a housing defining a sealed interior space, the housing being primarily comprised of a dielectric material, and an electrical separation structure interposed between a first phase and at least one of a second phase and a ground connection in the sealed interior space, wherein the housing has at least one rib extending along an exterior surface thereof to mechanically strengthen the housing to resist rupturing of the housing as a result of an internal pressure surge.

27. The sheath-bonding link box of claim 26, wherein the electrical separation structure includes at least one dielectric phase separator releasably securable within the interior space of the housing.

28. The sheath-bonding link box of claim 27, wherein the housing includes at least a pair of opposing channels within the interior space for retaining the at least one phase separator.

29. The sheath-bonding link box of claim 27, wherein the at least one dielectric phase separator is at least two dielectric phase separators positioned between the first phase and the second phase within the interior space of the sheath-bonding link box, and wherein the housing includes at least two pairs of opposing channels within the interior space for retaining the at least two dielectric phase separators.

30. A sheath-bonding link box, comprising a housing defining a sealed interior space, the housing being primarily comprised of a dielectric material, wherein the housing has at least one rib extending along an exterior surface thereof to mechanically strengthen the housing to resist rupturing of the housing as a result of an internal pressure surge, wherein the housing has at least one circumferential rib extending circumferentially about the housing.

31. The sheath-bonding link box of claim 30, wherein the dielectric material is an at least partially polymeric material.

32. The sheath-bonding link box of claim 31, wherein the dielectric material includes a stiffening additive.

\* \* \* \* \*